US012598738B2

(12) United States Patent
Kim et al.

(10) Patent No.: US 12,598,738 B2
(45) Date of Patent: Apr. 7, 2026

(54) SEMICONDUCTOR MEMORY DEVICE INCLUDING LOWER CONTACT PLUG PROTRUDING FROM SIDEWALL SPACERS

(71) Applicant: SAMSUNG ELECTRONICS CO., LTD., Suwon-si (KR)

(72) Inventors: Jongmin Kim, Suwon-si (KR); Chansic Yoon, Suwon-si (KR); Jihoon Sung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 309 days.

(21) Appl. No.: 18/233,357

(22) Filed: Aug. 14, 2023

(65) Prior Publication Data

US 2024/0172421 A1 May 23, 2024

(30) Foreign Application Priority Data

Nov. 21, 2022 (KR) ........................ 10-2022-0156187

(51) Int. Cl.
*H10B 12/00* (2023.01)
(52) U.S. Cl.
CPC ....... *H10B 12/482* (2023.02); *H10B 12/0335* (2023.02); *H10B 12/315* (2023.02)
(58) Field of Classification Search
CPC .... H10B 12/482; H10B 12/485; H10B 12/00; H10B 12/50; H10B 12/36; H10B 12/0335; H10B 12/315
See application file for complete search history.

(56) References Cited

U.S. PATENT DOCUMENTS

| | | | |
|---|---|---|---|
| 7,638,391 | B2 | 12/2009 | Cheng et al. |
| 9,159,730 | B2 | 10/2015 | Kim et al. |
| 9,478,548 | B2 | 10/2016 | Lee et al. |
| 9,620,451 | B2 | 4/2017 | Hwang et al. |
| 11,088,148 | B2 | 8/2021 | Kim et al. |

(Continued)

FOREIGN PATENT DOCUMENTS

| | | |
|---|---|---|
| KR | 10-2022-0062959 A | 5/2022 |
| TW | 200905804 | 7/1996 |
| TW | 202243113 A | 11/2022 |

OTHER PUBLICATIONS

Office Action dated May 1, 2024 issued in corresponding Taiwan Patent Application No. 112131228.

(Continued)

*Primary Examiner* — John P. Dulka
(74) *Attorney, Agent, or Firm* — Morgan, Lewis & Bockius LLP

(57) ABSTRACT

A semiconductor device includes an active pattern on a substrate. A bit line structure is on the active pattern. A spacer structure is on a sidewall of the bit line structure. A lower contact plug directly contacts the spacer structure. The spacer structure includes a first spacer covering an upper sidewall of the lower contact plug and a second spacer covering a lower sidewall of the lower contact plug and a portion of a lower surface of the lower contact plug. The lower contact plug includes an extension portion covered by the first and second spacers and a protrusion portion protruding from the first and second spacers. A bottom surface of the protrusion portion is disposed at a level that is lower than or equal to a level of a bottom surface of the second spacer.

20 Claims, 27 Drawing Sheets

(56)                    References Cited

U.S. PATENT DOCUMENTS

| | | | |
|---|---|---|---|
| 11,444,087 B2 | 9/2022 | Su | |
| 11,532,631 B2 * | 12/2022 | Kwon | H01L 21/76895 |
| 11,784,122 B2 | 10/2023 | Lee et al. | |
| 11,882,687 B2 | 1/2024 | Ryu et al. | |
| 2016/0035714 A1 * | 2/2016 | Kim | H01L 23/5329 |
| | | | 257/773 |
| 2016/0181143 A1 * | 6/2016 | Kwon | H10B 12/34 |
| | | | 438/586 |
| 2017/0005166 A1 * | 1/2017 | Park | H10D 62/115 |
| 2021/0335792 A1 | 10/2021 | Su | |
| 2022/0028860 A1 * | 1/2022 | Choi | H10B 12/053 |
| 2022/0165736 A1 | 5/2022 | Ryu et al. | |
| 2022/0216210 A1 | 7/2022 | Wei et al. | |
| 2022/0262728 A1 | 8/2022 | Lee et al. | |
| 2022/0336465 A1 | 10/2022 | Kim et al. | |

OTHER PUBLICATIONS

Office Action dated Feb. 19, 2026 issued in corresponding to Korean
Patent Application No. 10-2022-0156187.

* cited by examiner

SEMICONDUCTOR MEMORY DEVICE INCLUDING LOWER CONTACT PLUG PROTRUDING FROM SIDEWALL SPACERS

CROSS-REFERENCE TO RELATED APPLICATION

This application claims priority under 35 U.S.C. § 119 to Korean Patent Application No. 10-2022-0156187, filed on Nov. 21, 2022 in the Korean Intellectual Property Office, the disclosure of which is incorporated by reference in its entirety herein.

1. TECHNICAL FIELD

Embodiments of the present disclosure relate to a semiconductor device. More particularly, embodiments of the present disclosure relate to a DRAM device.

2. DISCUSSION OF RELATED ART

A capacitor in a DRAM device may include a lower electrode, an upper electrode and a dielectric layer between the lower and upper electrodes. A natural oxide layer may be formed between the dielectric layer and the lower electrode and/or the upper electrode. The natural oxide layer may decrease the electric characteristics of the capacitor.

SUMMARY

Embodiments of the present disclosure provide a semiconductor device having increased characteristics.

According to an embodiment of the present disclosure, a semiconductor device includes an active pattern on a substrate. A bit line structure is on the active pattern. A spacer structure is on a sidewall of the bit line structure. A lower contact plug directly contacts the spacer structure. The spacer structure includes a first spacer covering an upper sidewall of the lower contact plug. A second spacer covers a lower sidewall of the lower contact plug and a portion of a lower surface of the lower contact plug. The lower contact plug includes an extension portion covered by the first and second spacers. A protrusion portion protrudes from the first and second spacers. A bottom surface of the protrusion portion is disposed at a level that is lower than or equal to a level of a bottom surface of the second spacer.

According to an embodiment of the present disclosure, a semiconductor device includes an active pattern on a substrate. A bit line structure is on the active pattern. A spacer structure is on a sidewall of the bit line structure. A lower contact plug directly contacts the spacer structure. The spacer structure includes a first spacer covering a sidewall of the bit line structure. A second spacer directly contacts an outer sidewall of the first spacer. A third spacer directly contacts an upper outer sidewall of the second spacer. A fourth spacer directly contacts a lower outer sidewall of the second spacer. The lower contact plug includes an extension portion covered by the third and fourth spacers. A protrusion portion extends from the third and fourth spacers. A bottom surface of the protrusion portion is disposed at a level that is lower than or equal to a level of a bottom surface of the fourth spacer.

According to an embodiment of the present disclosure, a semiconductor device includes active patterns disposed on a substrate in first and second directions. The first and second directions are substantially parallel to an upper surface of the substrate and substantially perpendicular to each other. Each of the active patterns extends in a third direction substantially parallel to the upper surface of the substrate and having an acute angle with respect to the first and second directions. Bit line structures are disposed in the first direction. Each of the bit line structures extends in the second direction on central portions in the third direction of ones of the active patterns. Spacer structures are on opposite sidewalls, respectively, in the first direction of the bit line structures. A contact plug structure is on an end portion in the third direction of each of the active patterns. A capacitor is on the contact plug structure. The contact plug structure includes an extension portion covered by the spacer structures. A protrusion portion protrudes from the spacer structures. A bottom surface of the protrusion portion is disposed at a level that is lower than or equal to a level of a bottom surface of the spacer structures.

In the semiconductor device in accordance with an embodiment of the present disclosure, the contact plug structure for electrically connecting the capacitor to the active pattern may contact the active pattern well, so that the semiconductor device may have increased electric characteristics.

BRIEF DESCRIPTION OF THE DRAWINGS

FIGS. 4, 7-9, 11-18, 20-22 and 24-25 are cross-sectional views taken along lines A-A', respectively, of corresponding plan views, illustrating a method of manufacturing a semiconductor device according to embodiments of the present disclosure.

DETAILED DESCRIPTION OF EMBODIMENTS

The above and other aspects and features of a semiconductor device and a method of manufacturing the same in accordance with embodiments of the present disclosure will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second or third element, component, region, layer or section without departing from the teachings of inventive concepts.

Figure 1:
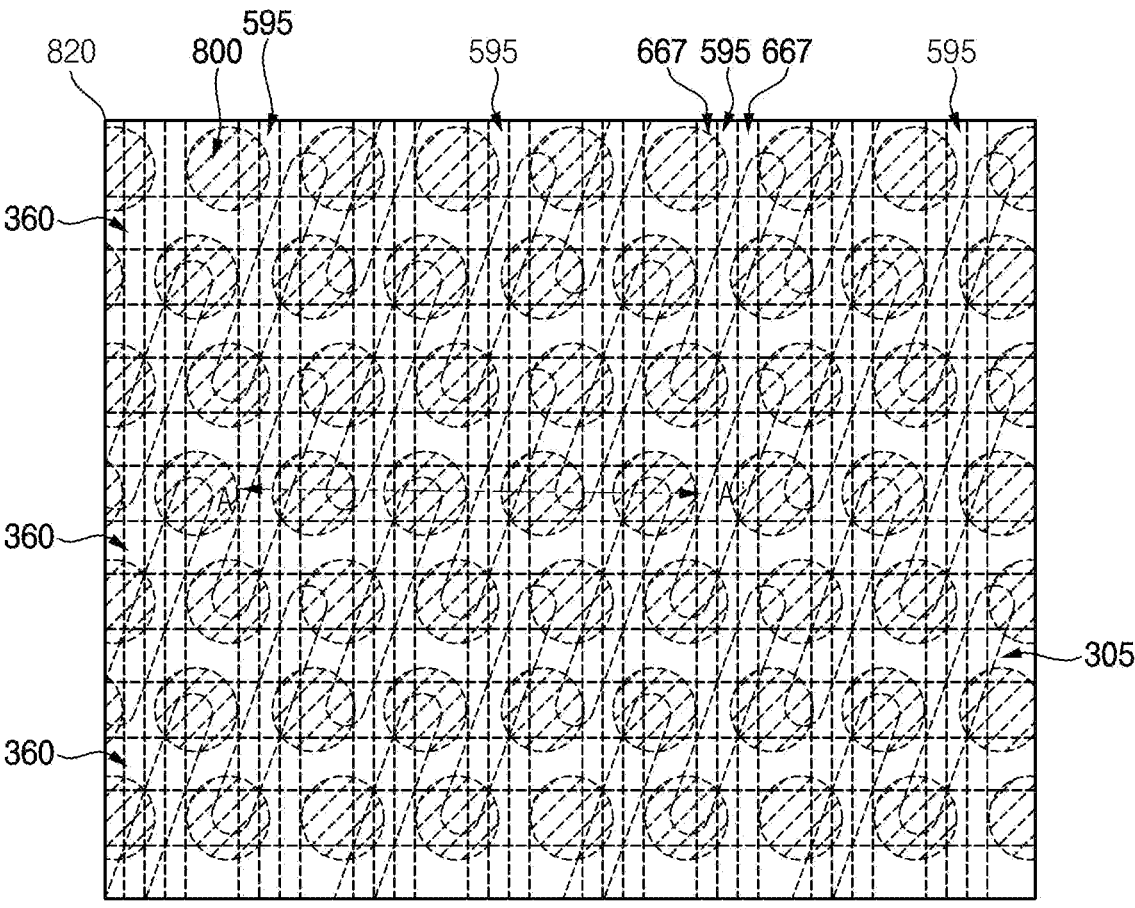
FIG. 1 is a plan view illustrating a semiconductor device in accordance with an embodiment of the present disclosure.
Figure 1:
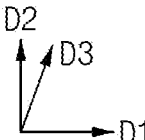
Figure 2A:
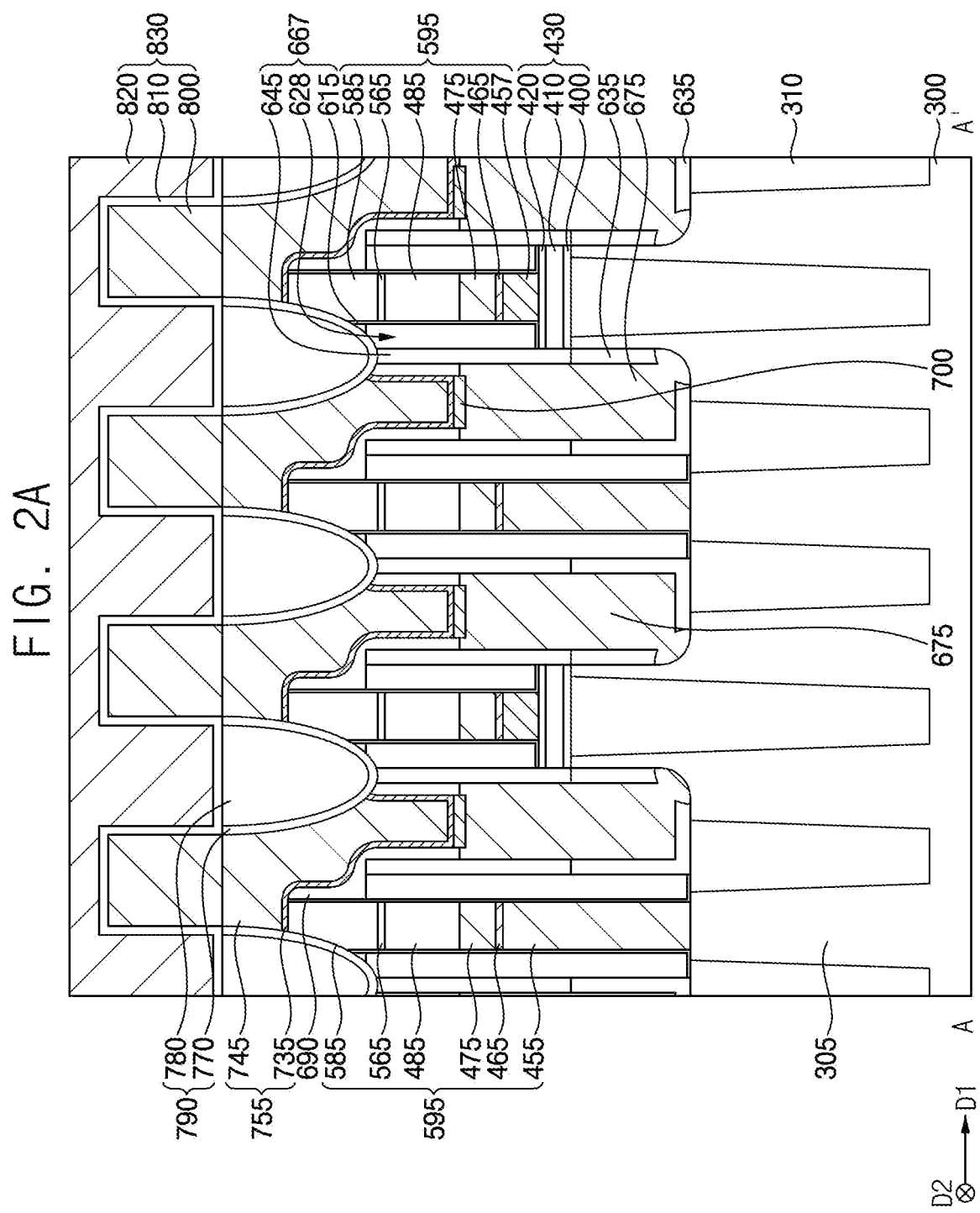
FIGS. 2A and 2B are cross-sectional views of a semiconductor device taken along line A-A' of FIG. 1 according to embodiments of the present disclosure.
Figure 2B:
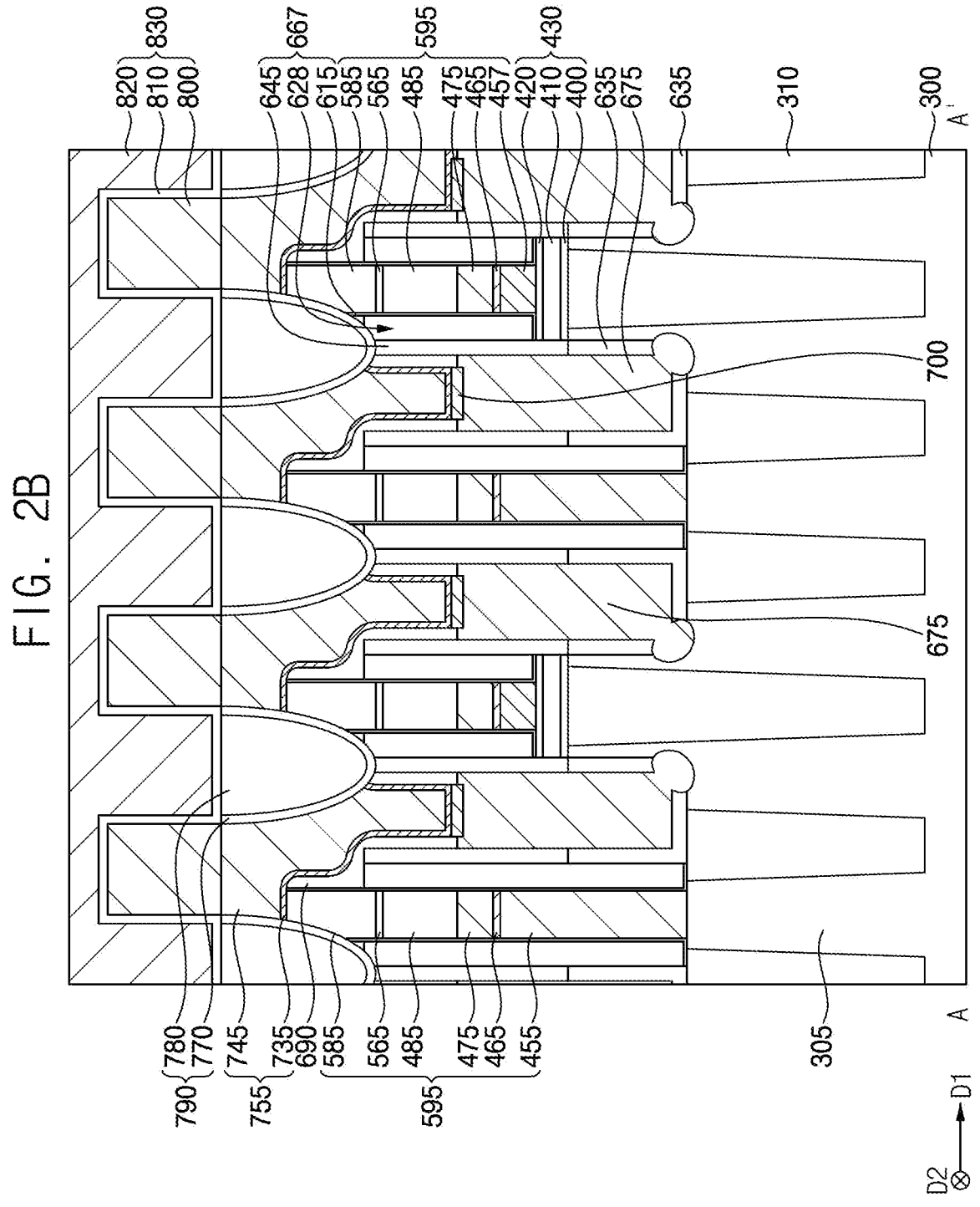

FIG. 1 is a plan view illustrating a semiconductor device in accordance with an embodiment of the present disclosure, and FIGS. 2A and 2B are cross-sectional views taken along line A-A' of FIG. 1.

Hereinafter, in the specification (and not necessarily in the claims), two directions among horizontal directions, which are substantially parallel to an upper surface of a substrate 300, substantially perpendicular to each other may be referred to as first and second directions D1 and D2, respectively, and a direction among the horizontal directions having an acute angle with respect to the first and second directions D1 and D2 may be referred to as a third direction D3.

Referring to FIGS. 1, 2A and 2B, the semiconductor device may include an active pattern 305, a gate structure 360, a bit line structure 595, a contact plug structure, and a capacitor 830 on the substrate 300.

The semiconductor device may further include an isolation pattern 310, a spacer structure, a fourth insulation pattern 685, first and second insulation pattern structures 430 and 790 and a metal silicide pattern 700.

In an embodiment, the substrate 300 may include silicon, germanium, silicon-germanium, or a III-V group compound semiconductor, such as GaP, GaAs, or GaSb. In some embodiments, the substrate 300 may be a silicon-on-insulator (SOI) substrate or a germanium-on-insulator (GOI) substrate.

The active pattern 305 may extend in the third direction D3, and a plurality of active patterns 305 may be spaced apart from each other in the first and second directions D1 and D2. A sidewall of the active pattern 305 may be covered by the isolation pattern 310. In an embodiment, the active pattern 305 may include substantially the same material as the substrate 300, and the isolation pattern 310 may include an oxide, such as silicon oxide.

Figure 5:
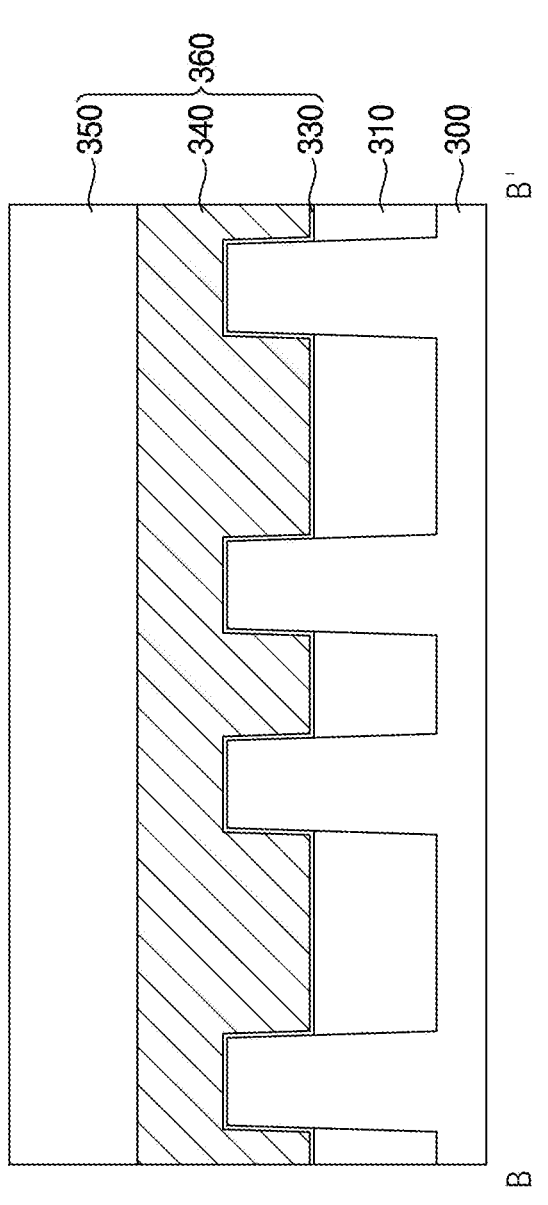
FIG. 5 is a cross-sectional view taken along line B-B' of FIG. 3 illustrating a method of manufacturing a semiconductor device according to an embodiment of the present disclosure.
Figure 5:

Referring to FIGS. 1, 2A and 2B together with FIG. 5, the gate structure 360 may be formed in a second recess extending in the first direction D1 through upper portions of the active pattern 305 and the isolation pattern 310. In an embodiment, the gate structure 360 may include a gate insulation pattern 330 on a bottom and a sidewall of the second recess, a gate electrode 340 on a portion of the gate insulation pattern 330 on the bottom and a lower sidewall of the second recess, and a gate mask 350 on the gate electrode 340 and filling an upper portion of the second recess.

In an embodiment, the gate insulation pattern 330 may include an oxide, such as silicon oxide. In an embodiment, the gate electrode 340 may include a metal, a metal nitride, a metal silicide, etc. In an embodiment, the gate mask 350 may include an insulating nitride, such as silicon nitride.

In some embodiments, the gate structure 360 may extend in the first direction D1, and a plurality of gate structures 360 may be spaced apart from each other in the second direction D2.

Figure 6:
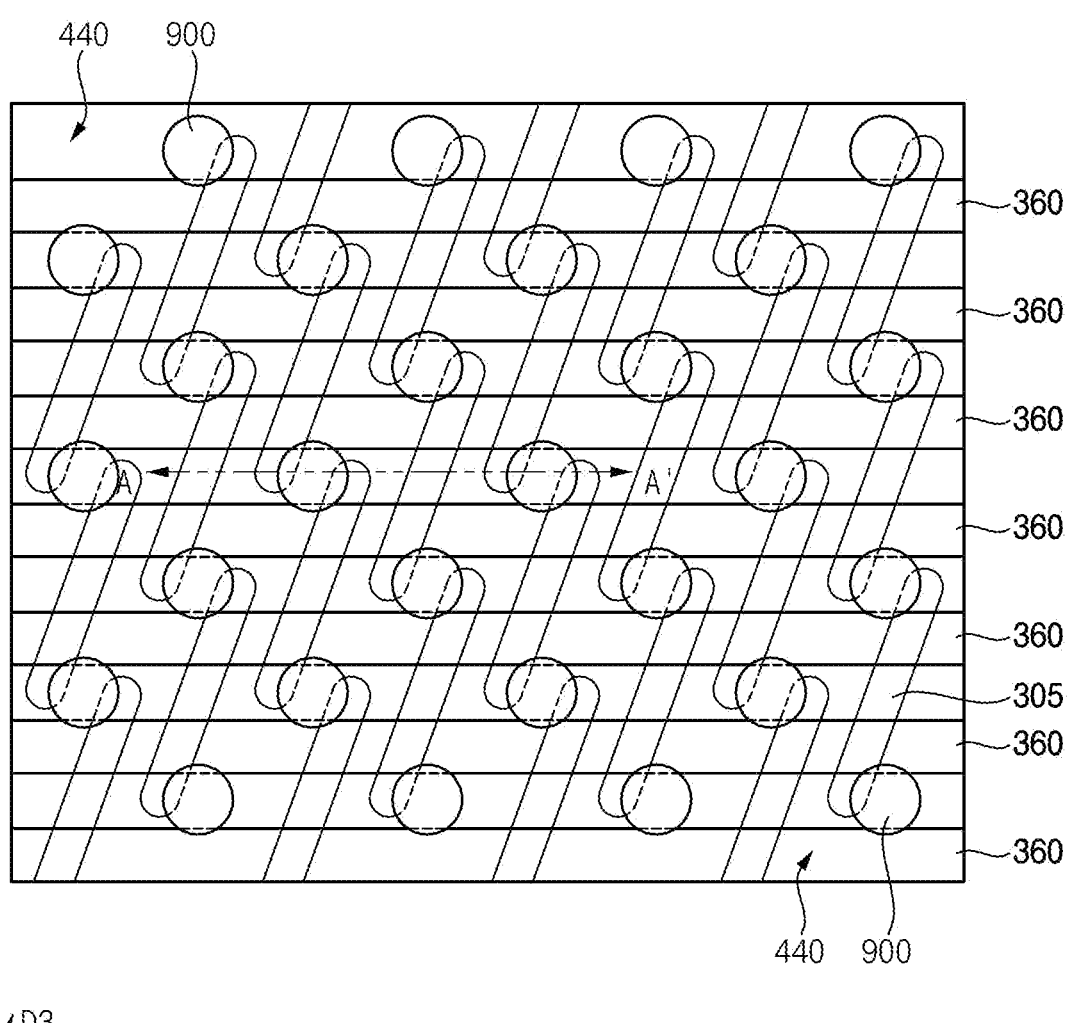
Figure 7:
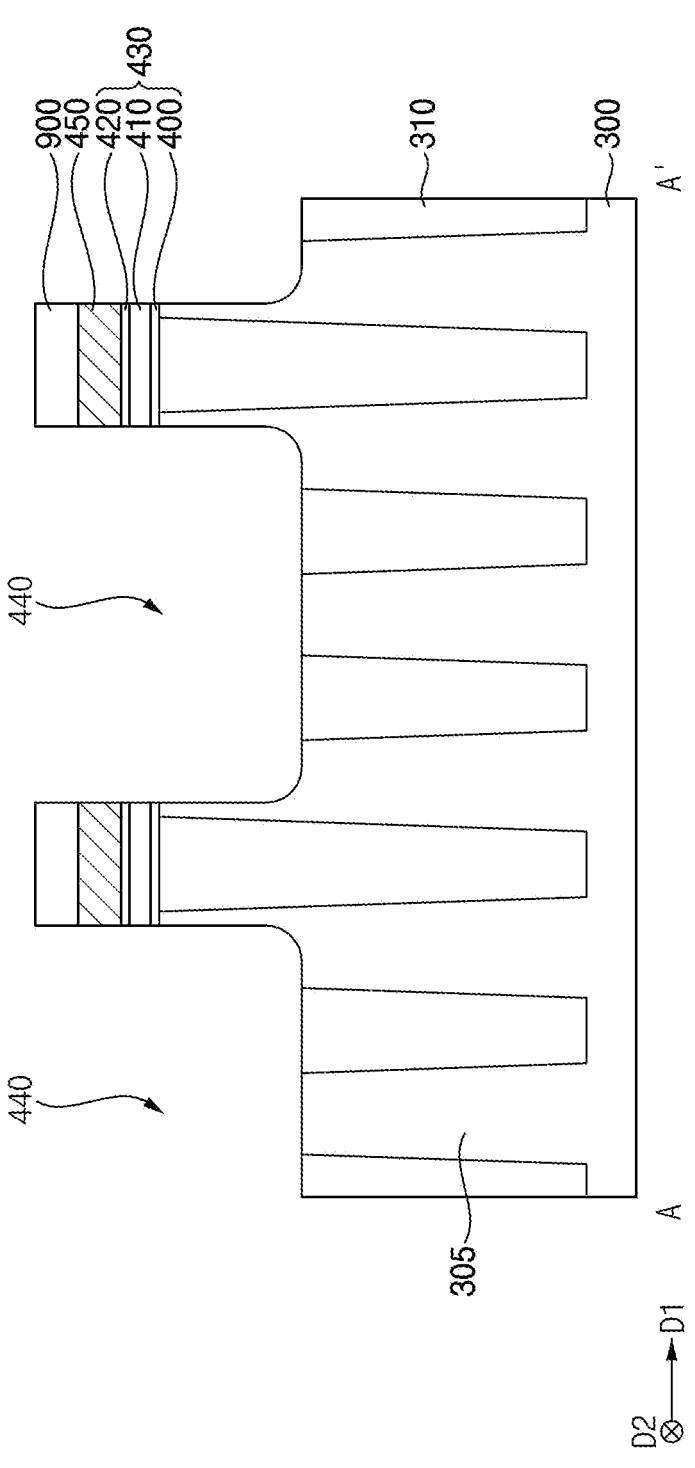

Referring to FIGS. 1, 2A and 2B together with FIGS. 6 and 7, a first opening 440 extending through a first insulation pattern structure 430 and exposing upper surfaces of the active pattern 305, the isolation pattern 310 and the gate mask 350 of the gate structure 360 may be formed, and an upper surface of a central portion in the third direction D3 of the active pattern 305 may be exposed by the first opening 440.

In some embodiments, the first insulation pattern structure 430 may be formed on an end portion in the third direction D3 of the active pattern 305 and a portion of the isolation pattern 310 adjacent thereto, and thus the first opening 440 may expose upper surfaces of other portions of the active pattern 305, an upper surface of a portion of the isolation pattern 310 and an upper surface of the gate structure 360 and extend through upper portions of the portions of the active pattern 305, the isolation pattern 310 and the gate structure 360. Accordingly, a bottom of the first opening 440 may be positioned at a lower level than the upper surface of the end portion of the active pattern 305.

In an embodiment, the first insulation pattern structure 430 may have a shape of a circle, an ellipse, a polygon or a polygon with rounded corners in a plan view. However, embodiments of the present disclosure are not necessarily limited thereto and the shape of the first insulation pattern structure 430 in a plan view may vary.

The first insulation pattern structure 430 may include first, second and third insulation patterns 400, 410 and 420 sequentially stacked in the vertical direction. However, embodiments of the present disclosure are not necessarily limited thereto and the number of the insulation patterns in the first insulation pattern structure 430 may vary. In an embodiment, the first and third insulation patterns 400 and 420 may include an oxide, such as silicon oxide, and the second insulation pattern 410 may include an insulating nitride, such as silicon nitride.

In an embodiment, the bit line structure 595 may include a first conductive pattern 457, a first barrier pattern 465, a third conductive pattern 475, a second mask 485, an etch stop pattern 565 and a capping pattern 585 sequentially stacked in the vertical direction on (e.g., stacked directly thereon) the first insulation pattern structure 430, or a second conductive pattern 455, the first barrier pattern 465, the third conductive pattern 475, the second mask 485, the etch stop pattern 565 and the capping pattern 585 sequentially stacked in the vertical direction on (e.g., stacked directly thereon) the first opening 440.

The first conductive pattern 457, the first barrier pattern 465 and the third conductive pattern 475 sequentially stacked in the vertical direction, or the second conductive pattern 455, the first barrier pattern 465 and the third conductive pattern 475 sequentially stacked in the vertical direction collectively form a conductive structure, and the second mask 485, the etch stop pattern 565 and the capping pattern 585 may collectively form an insulation structure.

In an embodiment, each of the first and second conductive patterns 457 and 455 may include doped polysilicon, the first barrier pattern 465 may include a metal nitride, such as titanium nitride, or a metal silicon nitride, such as titanium silicon nitride. The third conductive pattern 475 may include a metal, such as tungsten, and each of the second mask 485, the etch stop pattern 565 and the capping pattern 585 may include an insulating nitride, such as silicon nitride. However, embodiments of the present disclosure are not necessarily limited thereto.

In an embodiment, the bit line structure 595 may extend in the second direction D2 on the substrate 300, and a plurality of bit line structures 595 may be spaced apart from each other in the first direction D1. Each of the bit line structures 595 extending in the second direction D2 may overlap a central portion in the third direction D3 of each of the active patterns 305.

The spacer structure 665 may include an upper spacer structure 667 and fourth and fifth spacers 635 and 690.

The upper spacer structure 667 may include a first spacer 615 covering a sidewall of the bit line structure 595, and upper surfaces of the active pattern 305, the isolation pattern 310 and the first insulation pattern structure 430 adjacent to the bit line structure 595 in the first direction D1, an air spacer 628 on an outer sidewall of the first spacer 615, and a third spacer 645 covering an upper outer sidewall of the air spacer 628.

The fourth spacer 635 may cover a lower outer sidewall of the air spacer 628, and an upper surface of the fourth spacer 635 may directly contact a lower surface of the third spacer 645.

The fifth spacer 690 may be formed on an outer sidewall of a portion of the first spacer 615 on an upper sidewall of the bit line structure 595, and may cover a top end of the air spacer 628 and an upper surface of the third spacer 645.

In an embodiment, the first spacer 615 may have a thickness less than a thickness of the air spacer 628, for example, a thickness of about 5 Å. However, embodiments of the present disclosure are not necessarily limited thereto.

In an embodiment, each of the first, third, fourth and fifth spacers 615, 645, 635 and 690 may include an insulating nitride, such as silicon nitride, and the air spacer 628 may include air.

The contact plug structure may include a lower contact plug 675, a metal silicide pattern 700 and an upper contact plug 755 sequentially stacked in the vertical direction on (e.g., stacked directly thereon) the active pattern 305 and the isolation pattern 310.

The lower contact plug 675 may include an extension portion, which may be covered by the third and fourth spacers 645 and 635 and extend in the vertical direction, and a protrusion portion protruding from the extension portion and directly contacting the active pattern 305. For example, an upper surface of the extension portion of the lower contact plug 675 may be covered by the third spacer 645, and a lower sidewall and a lower surface of the extension portion of the lower contact plug 675 may be covered by the fourth spacer 635. In an embodiment, the protrusion portion of the lower contact plug 675 may protrude from the fourth spacer 635, and a bottom surface of the protrusion portion may be positioned at a level (e.g., in the vertical direction) that is not higher than (e.g., lower than or equal to) a bottom surface of the fourth spacer 635. For example, as shown in an embodiment of FIG. 2A, the protrusion portion of the lower contact plug 675 may have a bottom surface that is at a same level as a level of the bottom surface of the fourth spacer 635. As shown in an embodiment of FIG. 2B, the protrusion portion of the lower contact plug 675 may have a bottom surface that is lower than a level of the bottom surface of the fourth spacer 635.

In an embodiment, the protrusion portion of the lower contact plug 675 may directly contact an upper surface of each of opposite end portions in the third direction D3 of the active pattern 305. In an embodiment, a plurality of lower contact plugs 675 may be spaced apart from each other in the second direction D2 between ones of the bit line structures 595 adjacent to each other in the first direction D1, and the fourth insulation pattern 685 may be formed between ones of the lower contact plugs 675 adjacent in the second direction D2. In an embodiment, the fourth insulation pattern 685 may include an insulating nitride, such as silicon nitride.

In an embodiment, the lower contact plug 675 may include doped polysilicon, and the metal silicide pattern 700 may include titanium silicide, cobalt silicide, nickel silicide, etc. However, embodiments of the present disclosure are not necessarily limited thereto.

The upper contact plug 755 may include a second metal pattern 745 and a second barrier pattern 735 covering a lower surface of the second metal pattern 745. In an embodiment, the second metal pattern 745 may include a metal, such as tungsten, and the second barrier pattern 735 may include a metal nitride, such as titanium nitride. However, embodiments of the present disclosure are not necessarily limited thereto.

In an embodiment, a plurality of upper contact plugs 755 may be spaced apart from each other in the first and second directions D1 and D2, and may be arranged in a honeycomb pattern or a lattice pattern in a plan view. Each of the upper contact plugs 755 may have a shape of, for example a circle, an ellipse, or a polygon in a plan view. However, embodiments of the present disclosure are not necessarily limited thereto and the shape of the upper contact plugs 755 may vary.

Figure 23:
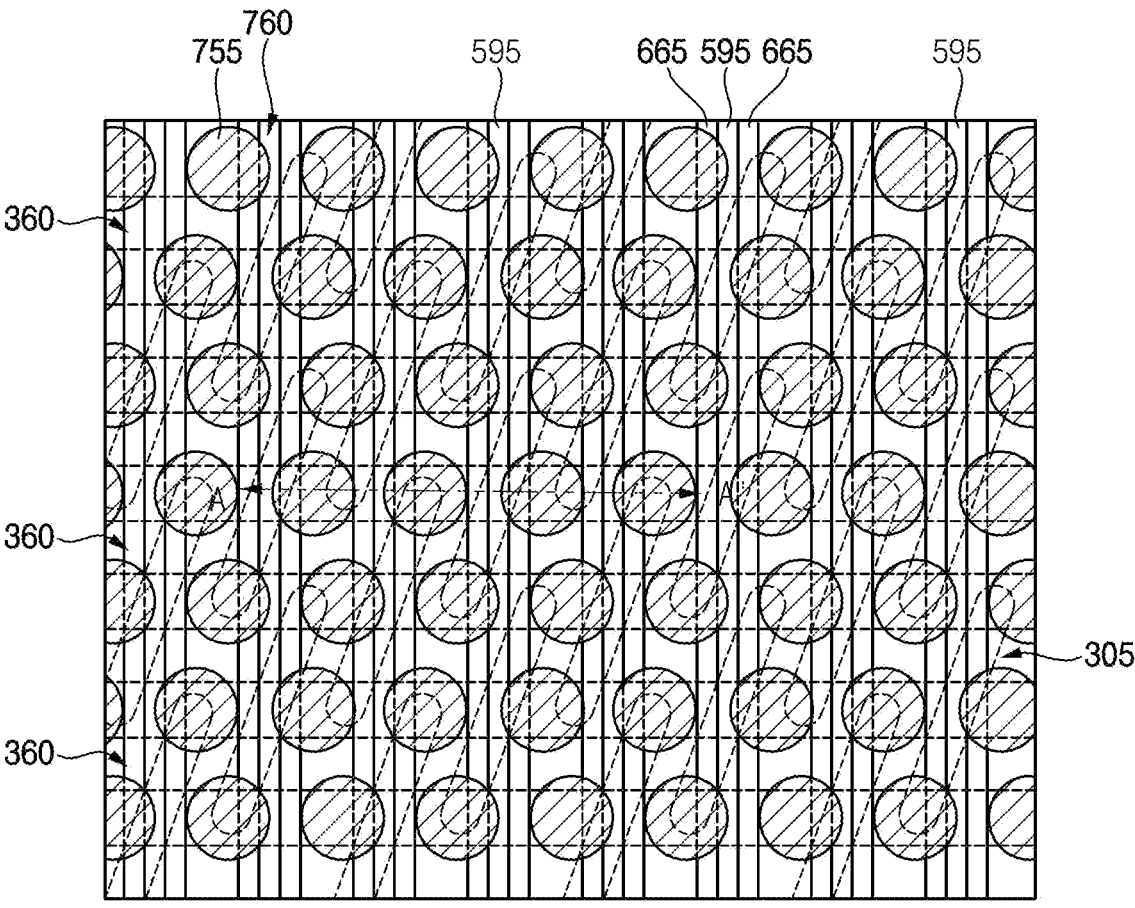
Figure 23:
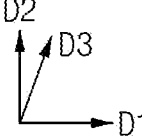
Figure 24:
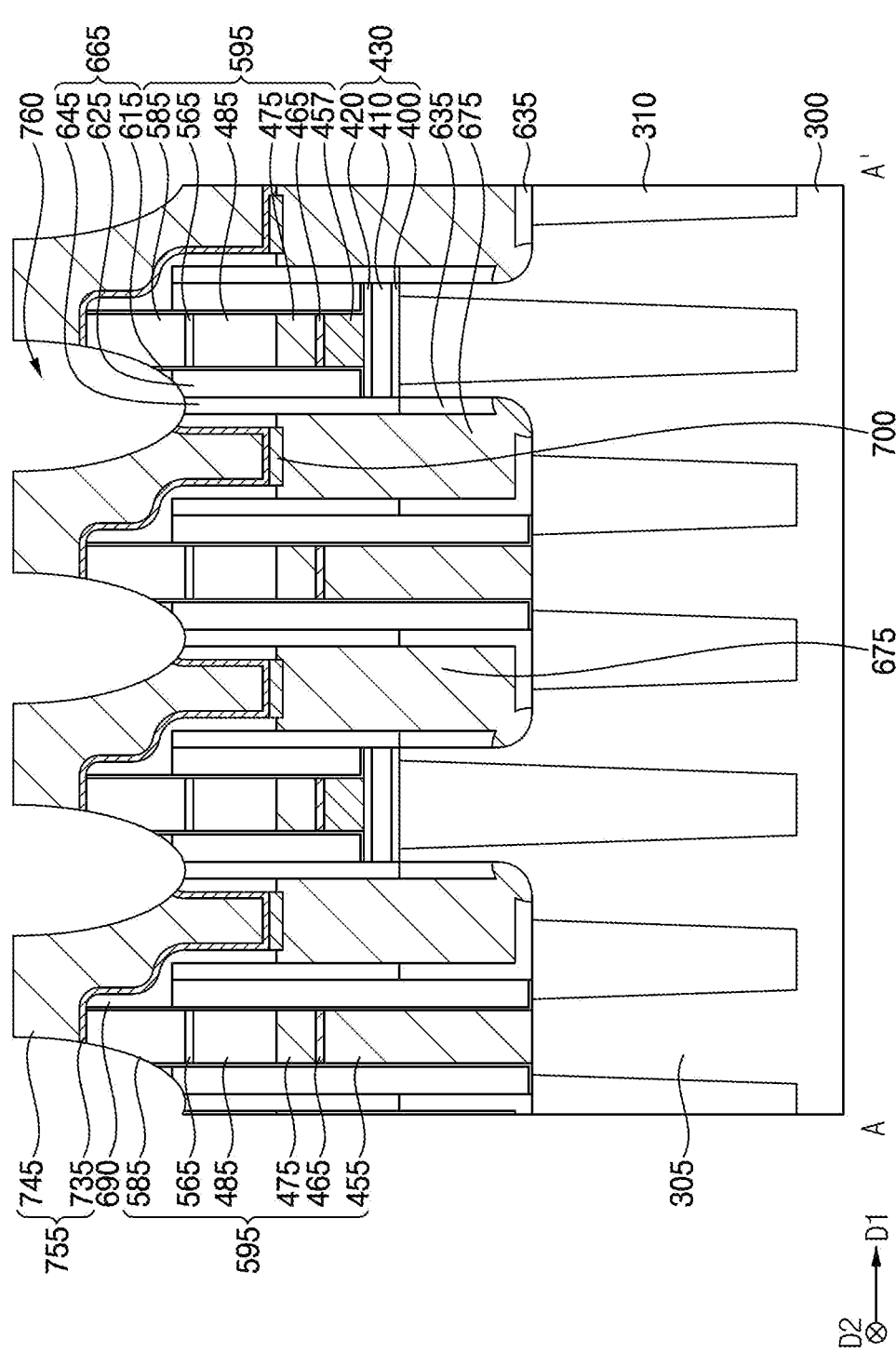

Referring to FIGS. 1, 2A and 2B together with FIGS. 23 and 24, the second insulation pattern structure 790 may include a fifth insulation pattern 770 on an inner wall of a fifth opening 760, which may extend through the upper contact plug 755, a portion of the insulation structure of the bit line structure 595 and a portion of the upper spacer structure 667 and surround the upper contact plug 755 in a plan view, and a sixth insulation pattern 780 on the fifth insulation pattern 770 and filling a remaining portion of the fifth opening 760. The upper end of the air spacer 628 may be closed by the fifth insulation pattern 770.

In an embodiment, the fifth and sixth insulation patterns 770 and 780 may include an insulating nitride, such as silicon nitride.

The capacitor 830 may include a lower electrode 800, a dielectric layer 810 and an upper electrode 820 sequentially stacked, and the lower electrode 800 may directly contact an upper surface of the upper contact plug 755.

In the semiconductor device, a first bit line structure among the bit line structures 595 may be formed on a central portion of a first active pattern among the active patterns 305, a first spacer structure among the spacer structures may be formed on a sidewall of the first bit line structure, and the protrusion portion of the lower contact plug 675 directly contacting the first spacer structure may directly contact an end portion in the third direction D3 of a second active pattern among the active patterns 305 that may be adjacent to the first active pattern in the first direction DL.

In an embodiments, an upper surface of the central portion of the first active pattern directly contacting the first bit line structure may be lower than an uppermost surface of the second active pattern.

In an embodiment, a second bit line structure among the bit line structures that may be adjacent to the first bit line structure in the first direction D1 may be formed on a central portion of the second active pattern, a second spacer structure among the spacer structures may be formed on a sidewall of the second bit line structure, and the first insulation pattern structure 430 may be formed between the second spacer structure and the uppermost surface of the second active pattern.

In an embodiment, the first insulation pattern structure 430 may be formed on only a portion of the end portion in the third direction D3 of the second active pattern, and may not overlap other portions of the end portion in the third direction D3 of the second active pattern in the vertical direction.

In an embodiment, the third spacer 645 included in the second spacer structure may not cover a sidewall of the first insulation pattern structure 430.

In an embodiment, the fourth spacer 635 included in the second spacer structure may cover an upper sidewall of the end portion in the third direction D3 of the second active pattern.

In an embodiment, a portion of the isolation pattern 310 covering the sidewall of the second active pattern may directly contact a lower surface of the first insulation pattern structure 430.

As illustrated below, the protrusion portion of the lower contact plug 675 may be easily formed to directly contact the upper surface of the active pattern 305, and thus the electric connection between the contact plug structure and the active pattern 305 may be increased. Accordingly, the semiconductor device may have increased electric characteristics.

FIGS. 3 to 25 are plan views and cross-sectional views illustrating a method of manufacturing a semiconductor device according to embodiments of the present disclosure. Specifically, FIGS. 3, 6, 10, 19 and 23 are the plan views, FIGS. 4, 7-9, 11-18, 20-22 and 24-25 are cross-sectional views taken along lines A-A', respectively, of corresponding plan views, and FIG. 5 is a cross-sectional view taken along line B-B' of FIG. 3.

Figure 3:
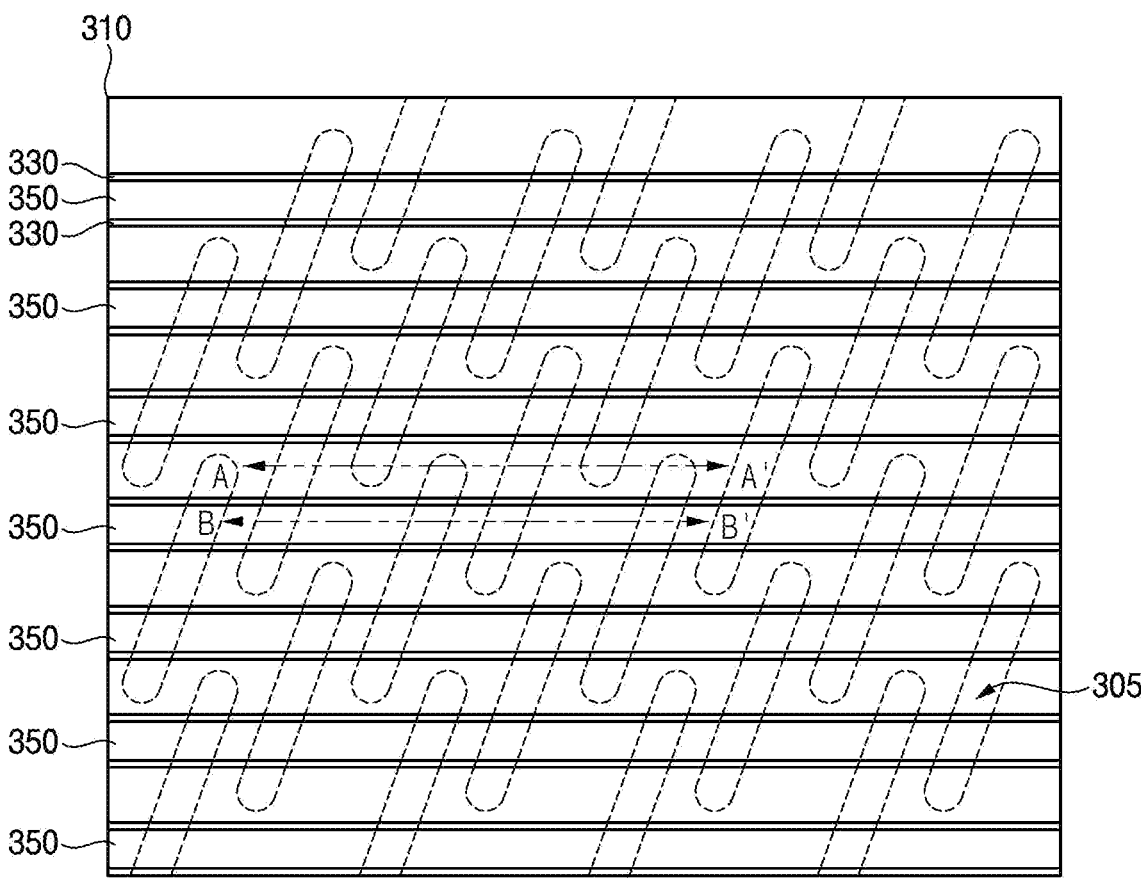
FIGS. 3, 6, 10, 19 and 23 are plan views illustrating a method of manufacturing a semiconductor device according to embodiments of the present disclosure.
Figure 3:
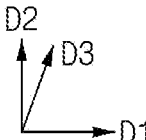
Figure 4:
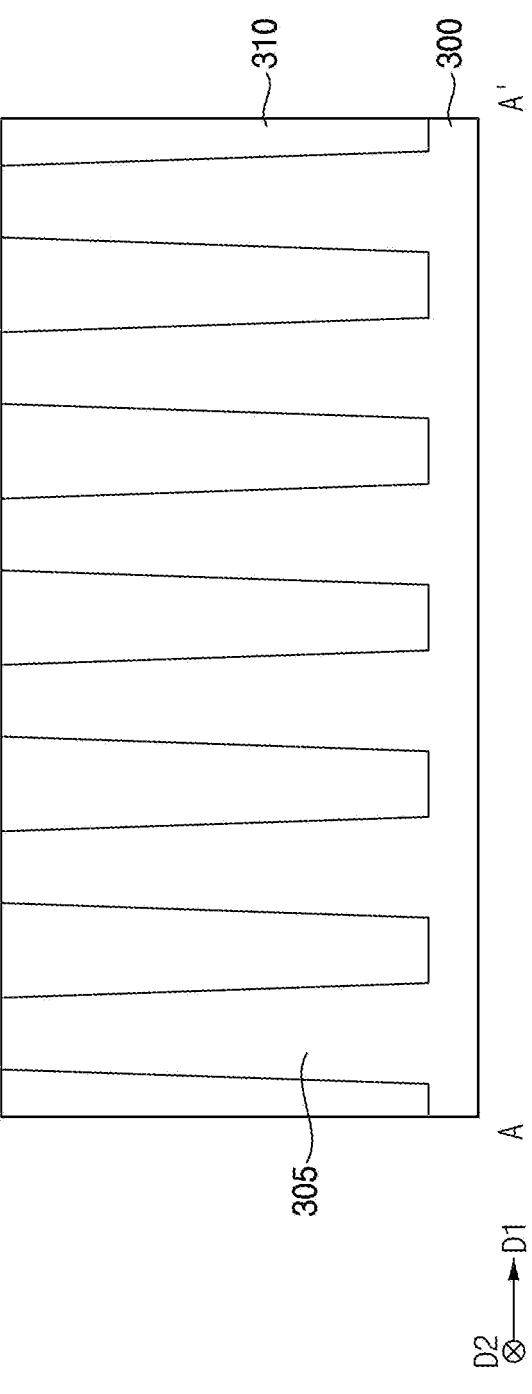

Referring to FIGS. 3 to 5, an upper portion of a substrate 300 may be removed to form a first recess, and an isolation pattern 310 may be formed in the first recess.

As the isolation pattern 310 is formed on the substrate 300, the isolation pattern 310 may define an active pattern 305 that has sidewalls covered by the isolation pattern 310. In an embodiment, the active pattern 305 may extend in the third direction D3, and a plurality of active patterns 305 may be spaced apart from each other in the first and second directions D1 and D2.

The active pattern 305 and the isolation pattern 310 on the substrate 300 may be partially etched to form a second recess extending in the first direction D1. A gate structure 360 may then be formed in the second recess. In an embodiment, the gate structure 360 may extend in the first direction D1, and a plurality of gate structures may be spaced apart from each other in the second direction D2.

Referring to FIGS. 6 and 7, an insulating layer structure and a first conductive layer may be sequentially formed on the active pattern 305, the isolation pattern 310 and the gate structure 360. A first mask 900 may be formed on the first conductive layer. An etching process may be performed using the first mask 900 as an etching mask on the first conductive layer and the insulation layer structure. During the etching process, upper portions of the active pattern 305, the isolation pattern 310 and the gate structure 360 may be partially etched.

Thus, a stack structure including a first insulation pattern structure 430, a preliminary first conductive pattern 450 and a first mask 900 sequentially stacked in the vertical direction may be formed on the active pattern 305, the isolation pattern 310 and the gate structure 360. A first opening 440 may be formed on portions of the active pattern 305, the isolation pattern 310 and the gate structure 360 on which the stack structure is not formed. The first insulation pattern structure 430 may include first to third insulation patterns 400, 410, and 420 sequentially stacked. However, embodiments of the present disclosure are not necessarily limited thereto and the number of the insulation patterns of the first insulation pattern structure 430 may vary.

In an embodiment, the first and third insulation patterns 400 and 420 may include an oxide, such as silicon oxide, the second insulation pattern 410 may include an insulating nitride, such as silicon nitride. The preliminary first conductive pattern 450 may include doped polysilicon. However, embodiments of the present disclosure are not necessarily limited thereto.

In an embodiment, the stack structure may have a shape of a circle, an ellipse, a polygon, or a polygon with rounded corners in a plan view. However, embodiments of the present disclosure are not necessarily limited thereto. A plurality of stack structures may be spaced apart from each other in the first and second direction D1 and D2. Each of the stack structures may overlap end portions in the third direction D3 of ones of the active patterns 305 adjacent to each other, which may face each other, in the vertical direction, and thus the first opening 440 may expose a portion of the active pattern 305 not covered by the stack structure.

Figure 8:
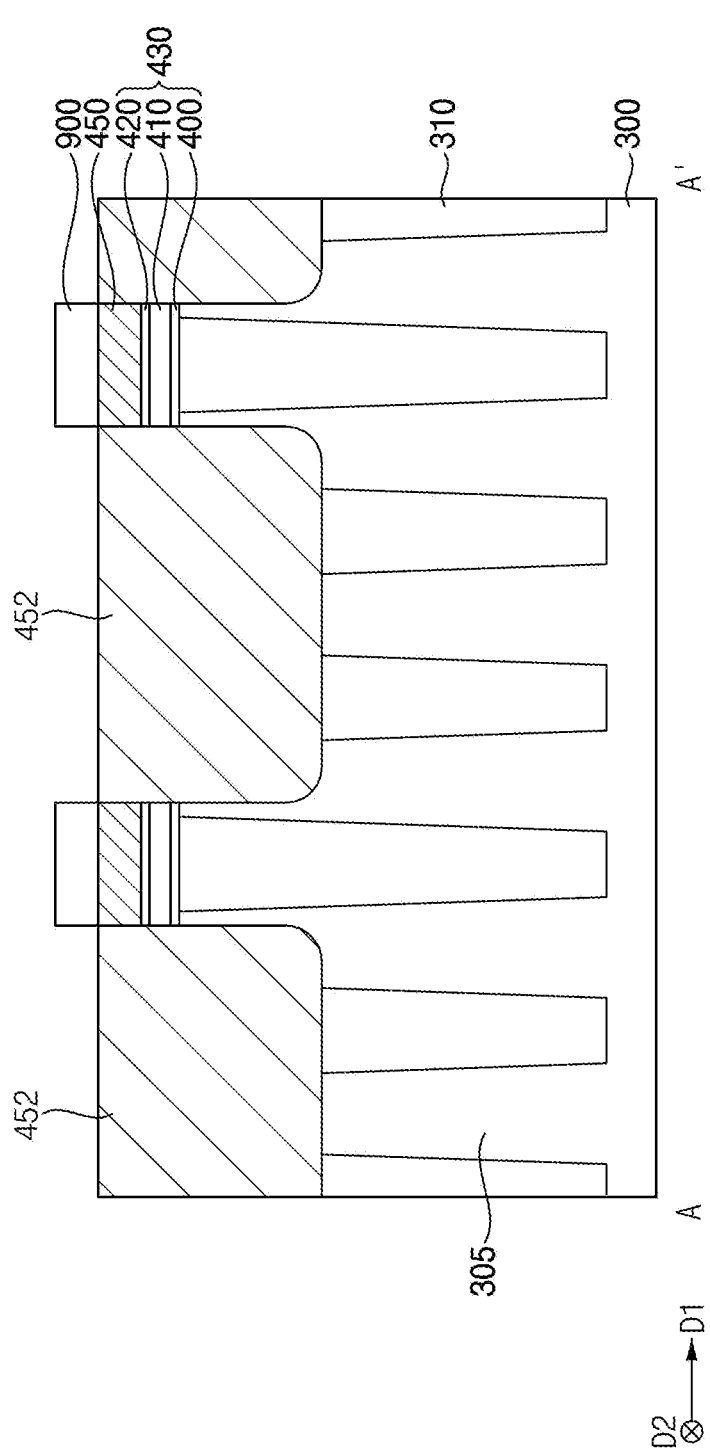

Referring to FIG. 8, a second conductive layer may be formed on the substrate 300 having the stack structure thereon, and an upper portion of the second conductive layer may be removed, such as by an etch back process, and thus a preliminary second conductive pattern 452 may be formed in the first opening 440.

The preliminary conductive pattern 452 may be formed on the active pattern 305, the isolation pattern 310 and the gate structure 360. The preliminary conductive pattern 452 may surround the first insulation pattern structure 430 and the preliminary first conductive pattern 450 included in the stack structure. In an embodiment, an upper surface of the preliminary second conductive pattern 452 may be substantially coplanar (e.g., in a vertical direction) with an upper surface of the preliminary first conductive pattern 450. In an embodiment, the preliminary conductive pattern 452 may include doped polysilicon, and in some embodiments, may be merged with the preliminary first conductive pattern 450. However, embodiments of the present disclosure are not necessarily limited thereto.

Figure 9:
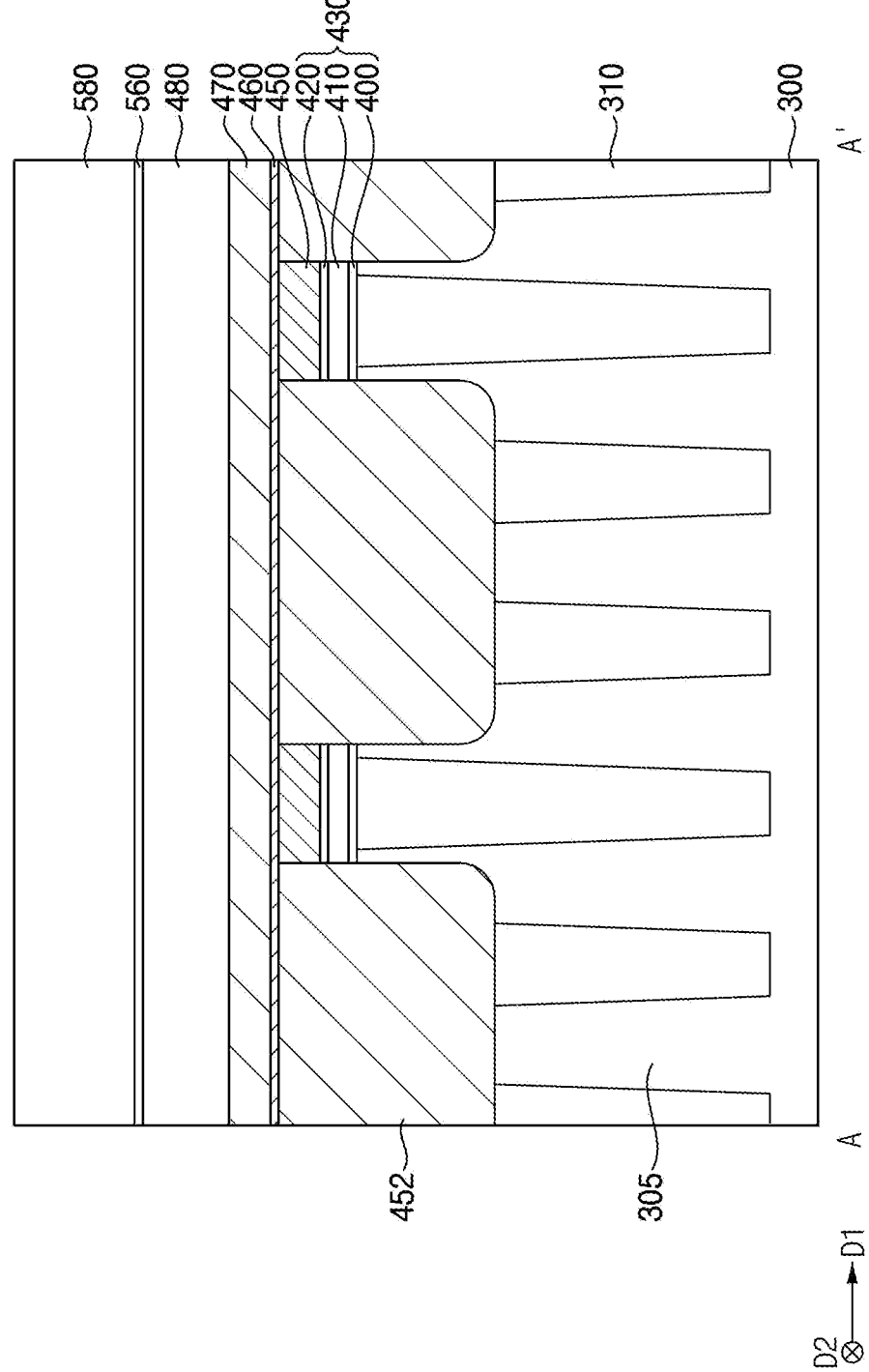

Referring to FIG. 9, the first mask 900 included in the stack structure may be removed to expose an upper surface of the first insulation pattern structure 430 (e.g., an upper surface of the preliminary first conductive pattern 450), and a first barrier layer 460, a third conductive layer 470, a second mask layer 480, an etch stop layer 560 and a capping layer 580 may be sequentially stacked on the exposed upper surface of the first insulation pattern structure 430 and the upper surface of the preliminary conductive pattern 452.

Figure 10:
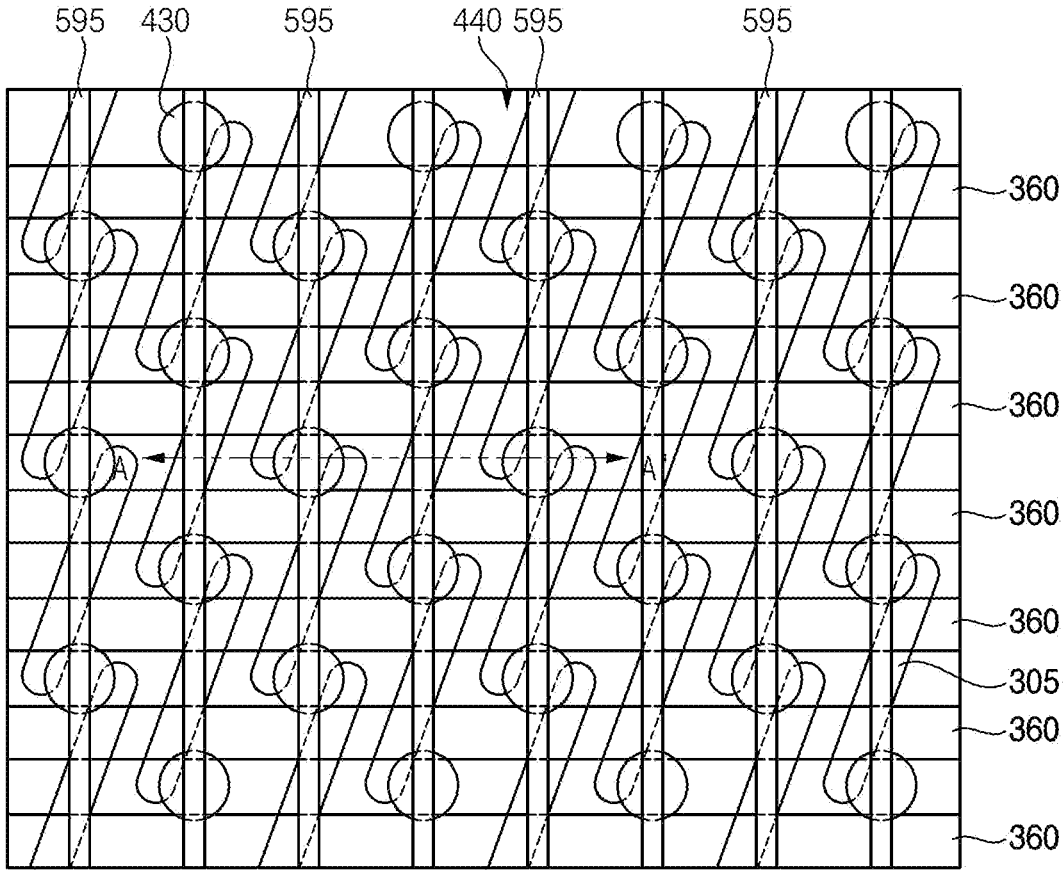
Figure 10:
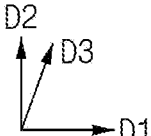
Figure 11:
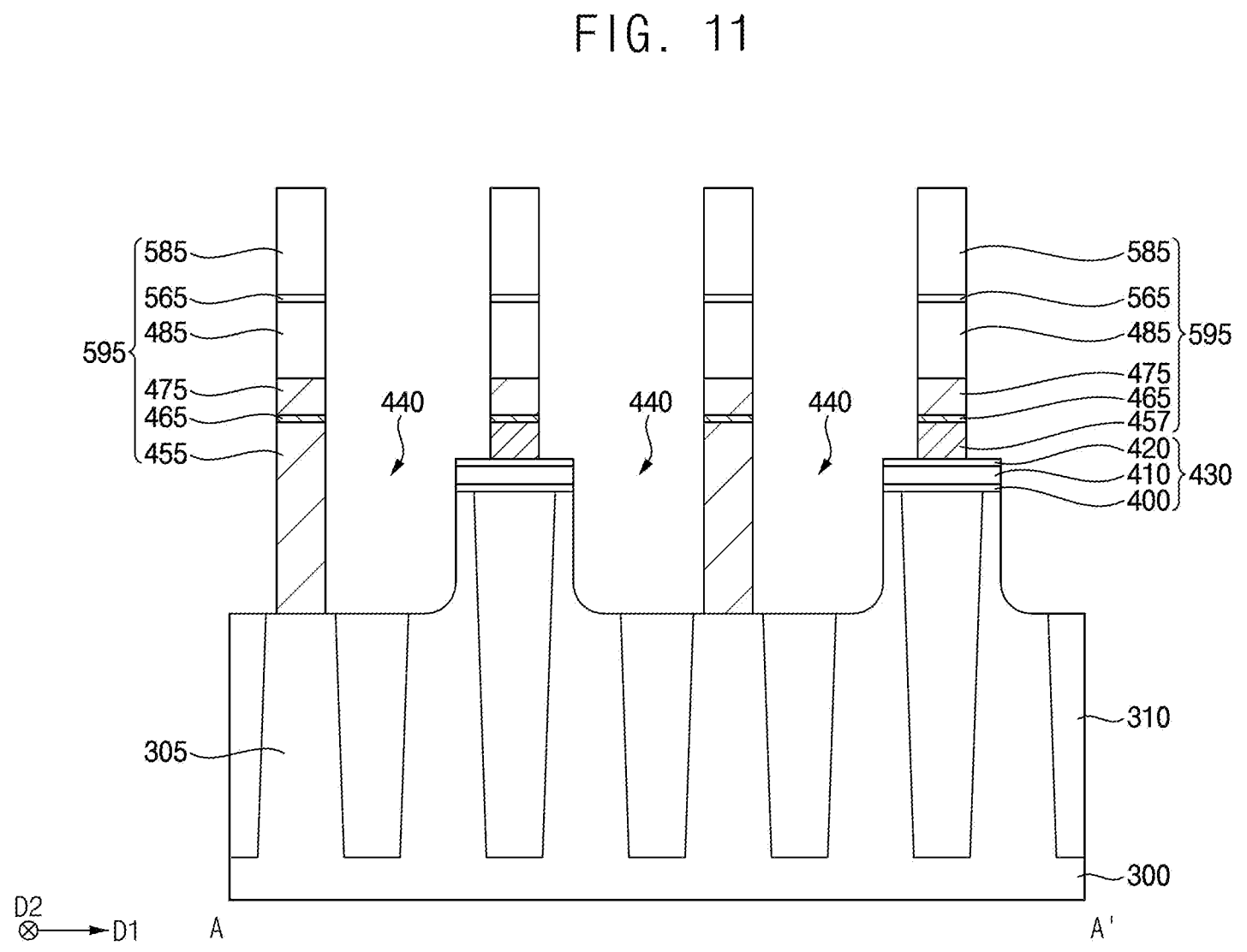

Referring to FIGS. 10 and 11, in an embodiment the capping layer 580 may be etched to form a capping pattern 585, and the etch stop layer 560, the second mask layer 480, the third conductive layer 470, the first barrier layer 460 and the preliminary first and second conductive patterns 450 and 452 may be sequentially etched using the capping pattern 585 as an etching mask. However, embodiments of the present disclosure are not necessarily limited thereto.

In an embodiment, the capping pattern 585 may extend in the second direction D2, and a plurality of capping patterns 585 may be spaced apart from each other in the first direction D1.

By the etching process, a first conductive pattern 457, a first barrier pattern 465, a third conductive pattern 475, a second mask 485, an etch stop pattern 565 and the capping pattern 585 may be sequentially stacked on the first insulation pattern structure 430, and a second conductive pattern 455, the first barrier pattern 465, the third conductive pattern 475, the second mask 485, the etch stop pattern 565 and the capping pattern 585 may be sequentially stacked on the first opening 440, such as stacked in the first opening 440 above a central portion of the active pattern 305.

Hereinafter, the first conductive pattern 457, the first barrier pattern 465, the third conductive pattern 475, the second mask 485, the etch stop pattern 565 and the capping pattern 585 sequentially stacked, or the second conductive pattern 455, the first barrier pattern 465, the third conductive pattern 475, the second mask 485, the etch stop pattern 565 and the capping pattern 585 sequentially stacked may be collectively referred to as a bit line structure 595.

The first conductive pattern 457, the first barrier pattern 465 and the third conductive pattern 475, or the second conductive pattern 455, the first barrier pattern 465 and the third conductive pattern 475 may form a conductive structure, and the second mask 485, the etch stop pattern 565 and the capping pattern 585 may form an insulation structure.

In an embodiment, the bit line structure 595 may extend in the second direction D2 on the substrate 300, and a plurality of bit line structures 595 may be spaced apart from each other in the first direction D1. Each of the bit line structures 595 may directly contact an upper surface of a central portion in the third direction D3 of a corresponding ones of the active patterns 305.

Figure 12:
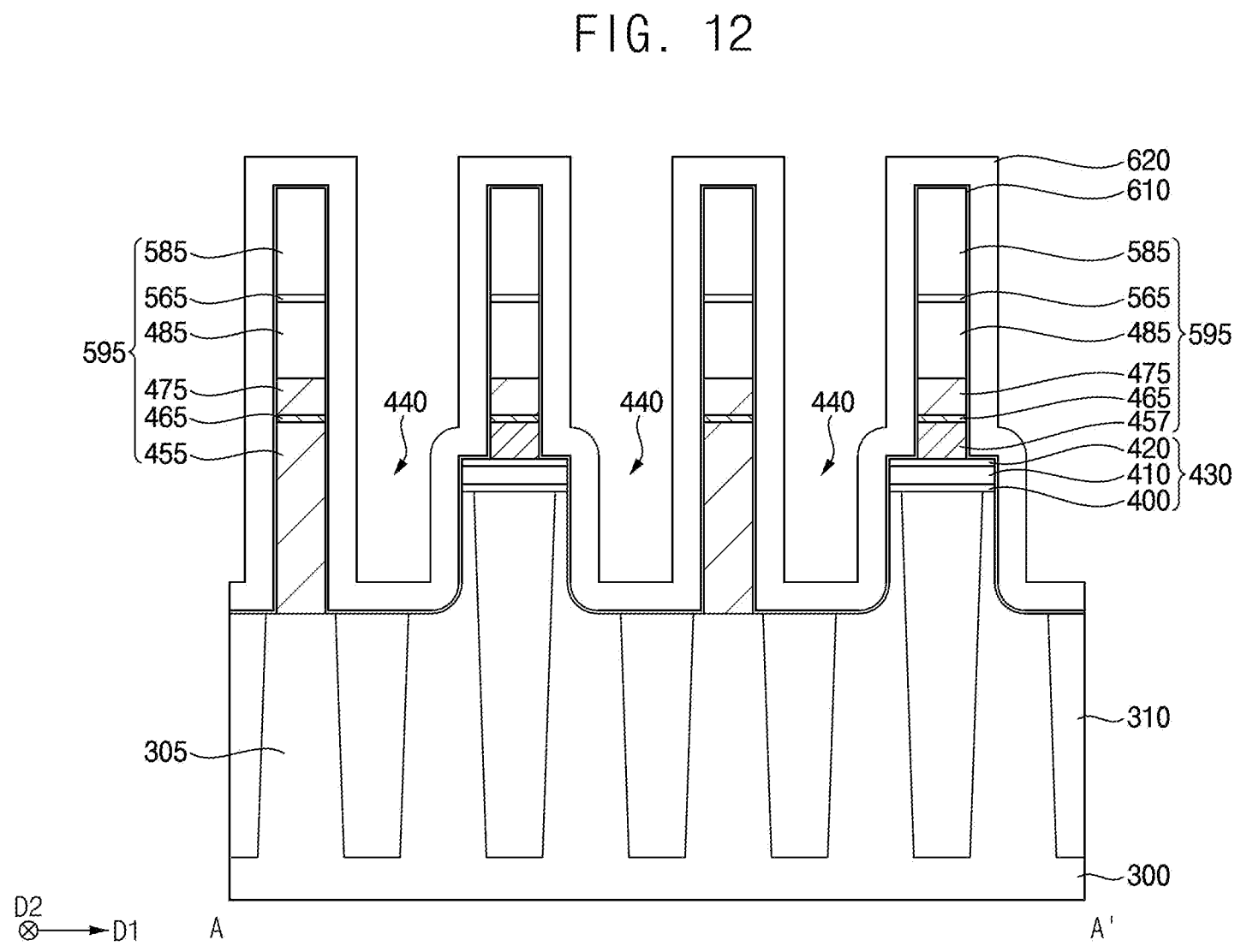

Referring to FIG. 12, a first spacer layer 610 may be formed on the bit line structure 595, the first insulation pattern structure 430, the active pattern 305, the isolation pattern 310 and the gate structure 360, and a second spacer layer 620 may be formed on (e.g., formed directly thereon) the first spacer layer 610.

In an embodiment, the first spacer layer 610 may include an insulating nitride, such as silicon nitride, and the second spacer layer 620 may include an oxide, such as silicon oxide. In an embodiment, the first spacer layer 610 may have a thickness less than a thickness of the second spacer layer 620. In an embodiment, the first spacer layer 610 may have a thickness of about 5 Å.

Figure 13:
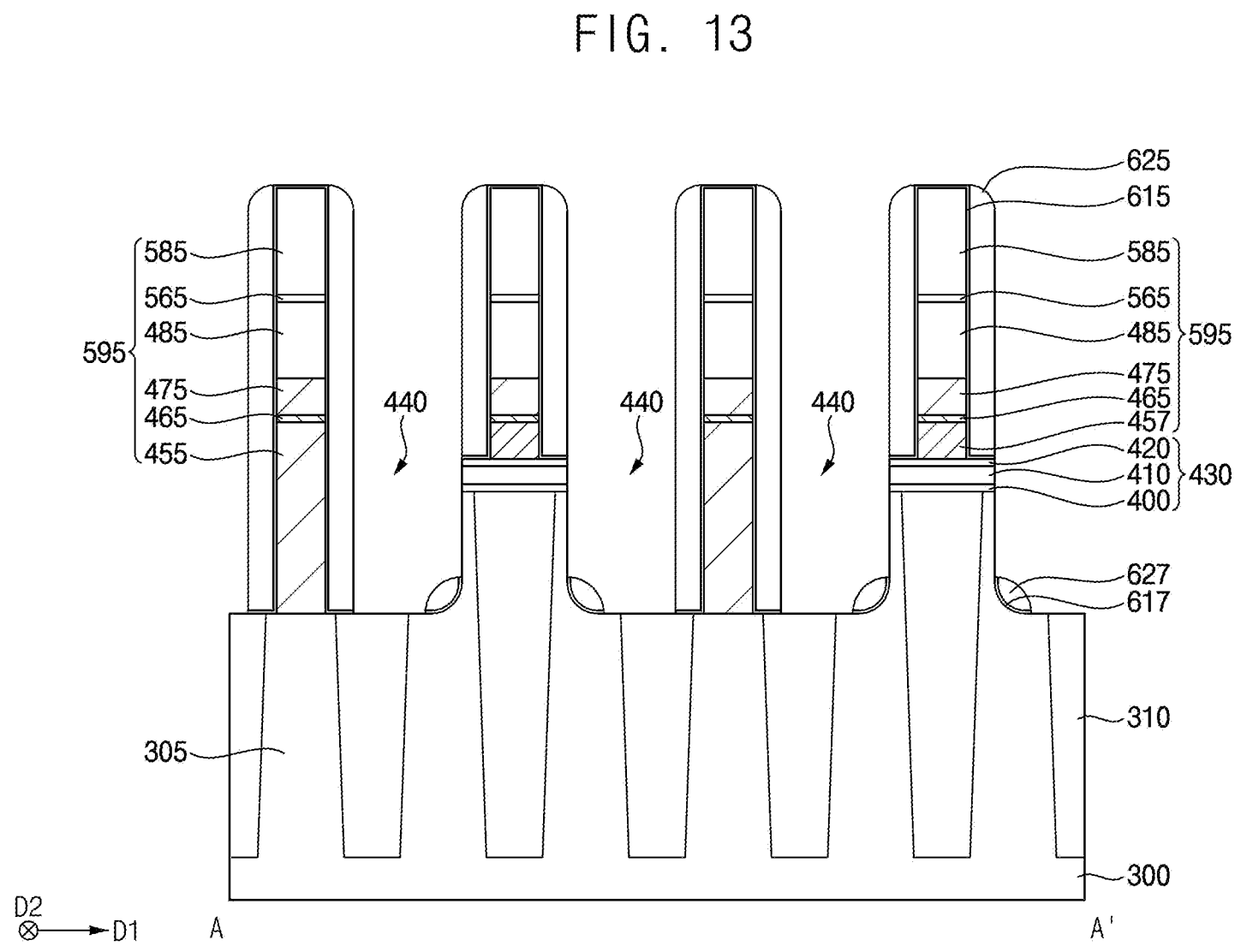

Referring to FIG. 13, the second spacer layer 620 may be anisotropically etched so that portions of the second spacer layer 620 on a portion of the first spacer layer 610 positioned on an upper surface of the bit line structure 595, a sidewall of the first insulation pattern structure 430, and upper surfaces of the active pattern 305, the isolation pattern 310 and the gate structure 360 are removed. The first spacer layer 610 may also be partially removed.

Thus, the first spacer layer 610 may remain as a first spacer 615 on the upper surface and a sidewall of the bit line structure 595, and the portion of an upper surface of the first insulation pattern structure 430 adjacent to the bit line structure 595 and the upper surfaces of the active pattern 305, the isolation pattern 310 and the gate structure 360 adjacent to the bit line structure 595, and the second spacer layer 620 may remain as a second spacer 625 on outer sidewalls of the first spacer 615 on the sidewalls of the bit line structure 595.

Portions of the first and second spacer layers 610 and 620 on a portion of the active pattern 305 adjacent to the first insulation pattern structure 430 in the first opening 440 may remain as first and second sacrificial patterns 617 and 627, respectively, which may form a sacrificial structure. In an embodiment, a plurality of sacrificial structures may be spaced apart from each other in the second direction D2 between ones of the bit line structures 595 adjacent in the first direction D1, and may be arranged in a zigzag pattern in the second direction D2.

Figure 14:
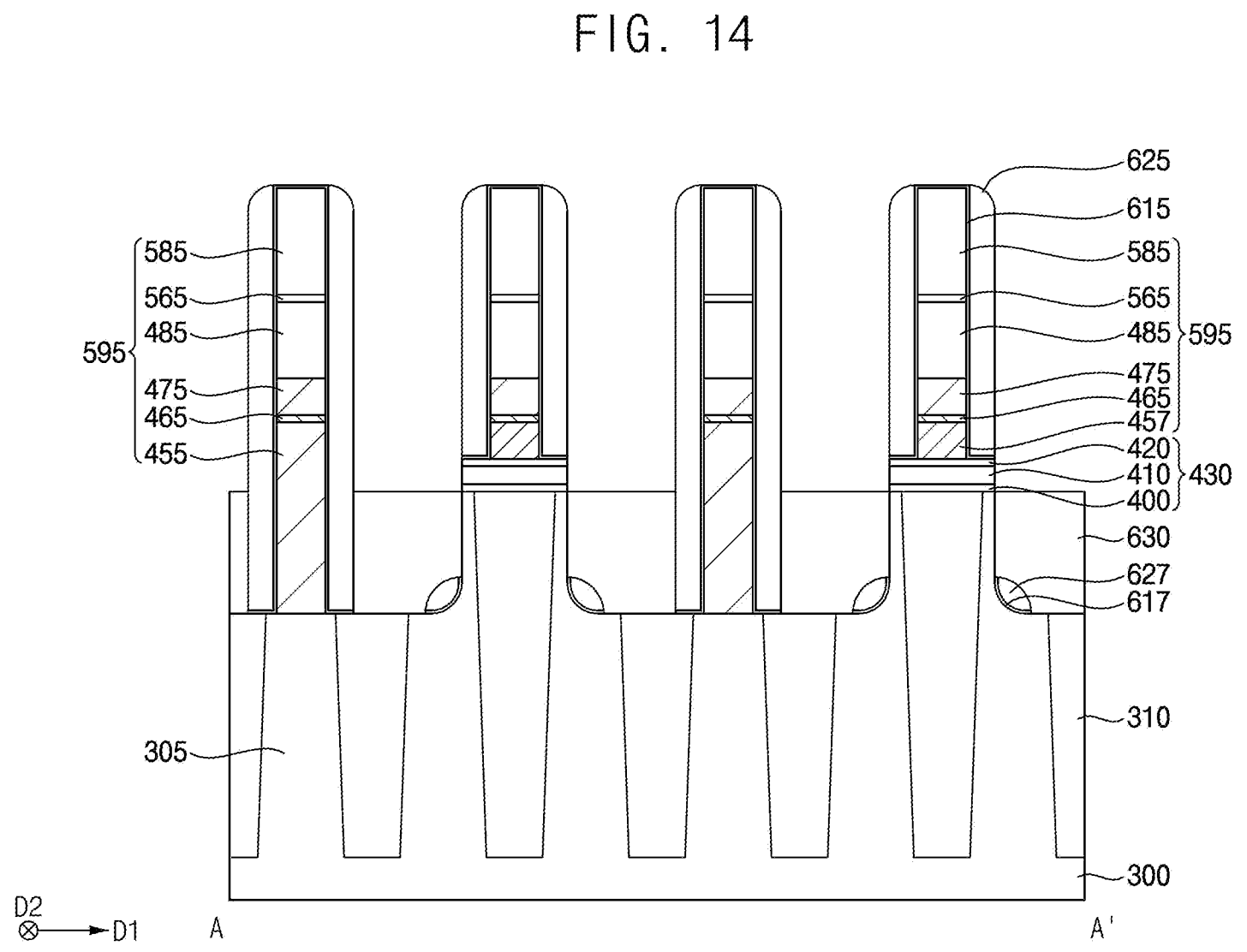

Referring to FIG. 14, a filling layer may be formed on the first and second spacers 615 and 625, the sacrificial structure, the active pattern 305, the isolation pattern 310 and the gate structure 360. In an embodiment, a stripping process may be performed on the filling layer using, for example, hydrofluoric acid (HF) or phosphoric acid (H₃PO₄) to form a filling pattern 630 in the first opening 440.

In an embodiment, the filling pattern 630 may include an insulating nitride, such as silicon nitride.

Figure 15:
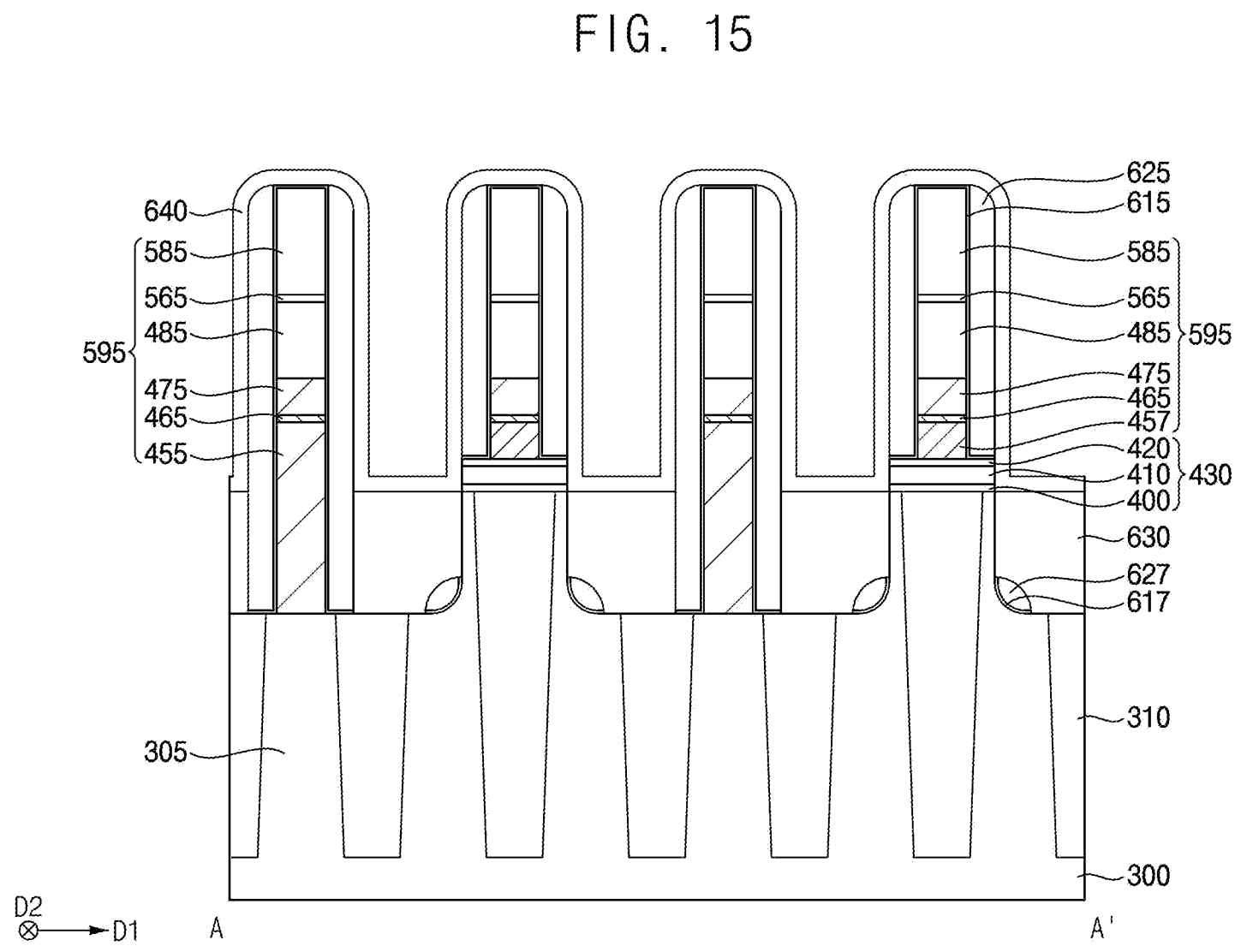

Referring to FIG. 15, a third spacer layer 640 may be formed on (e.g., formed directly thereon) the first and second spacers 615 and 625 and the filling pattern 630.

In an embodiment, the third spacer layer 640 may include an insulating nitride, e.g., silicon nitride.

Figure 16:
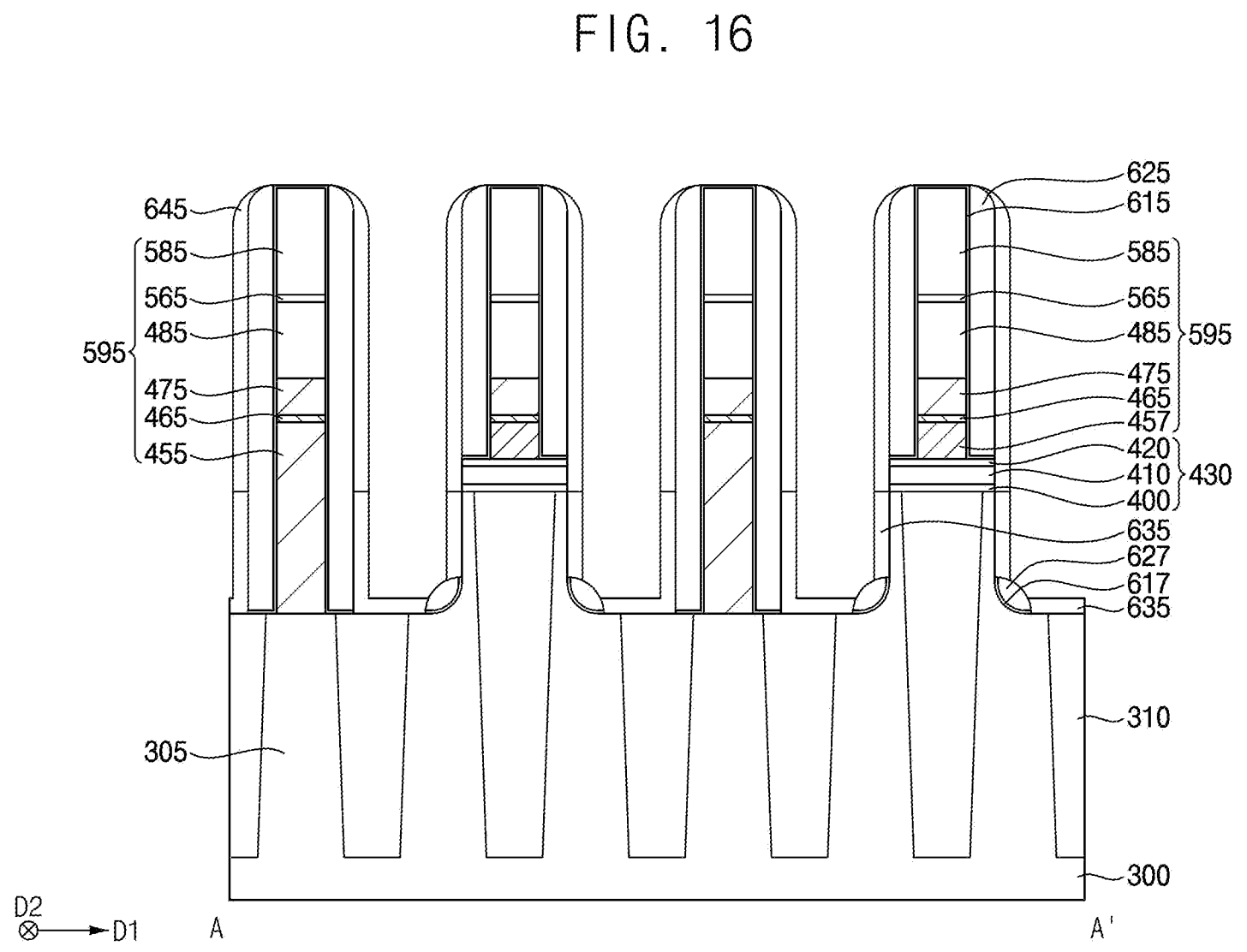

Referring to FIG. 16, in an embodiment a dry etching process may be performed on the third spacer layer 640 and the filling pattern 630, so that a surface (e.g., a partial portion of the surface) of the second sacrificial pattern 627 included in the sacrificial structure may be exposed.

By the dry etching process, the third spacer layer 640 may be transformed into a third spacer 645 on sidewalls of the first and second spacers 615 and 625 and the first insulation pattern structure 430, and the filling pattern 630 may be transformed into a fourth spacer 635 contacting the sidewalls of the first and second spacers 615 and 625, and the upper surfaces of the active pattern 305, the isolation pattern 310 and the gate structure 360 under the third spacer 645. The fourth spacer 635 may expose a surface of the sacrificial structure, such as a portion of the second sacrificial pattern 627 between a portion of the fourth spacer 635 extending in the first direction D1 on the active pattern 305 and a portion of the fourth spacer 635 extending in the vertical direction on the active pattern 305.

Figure 17A:
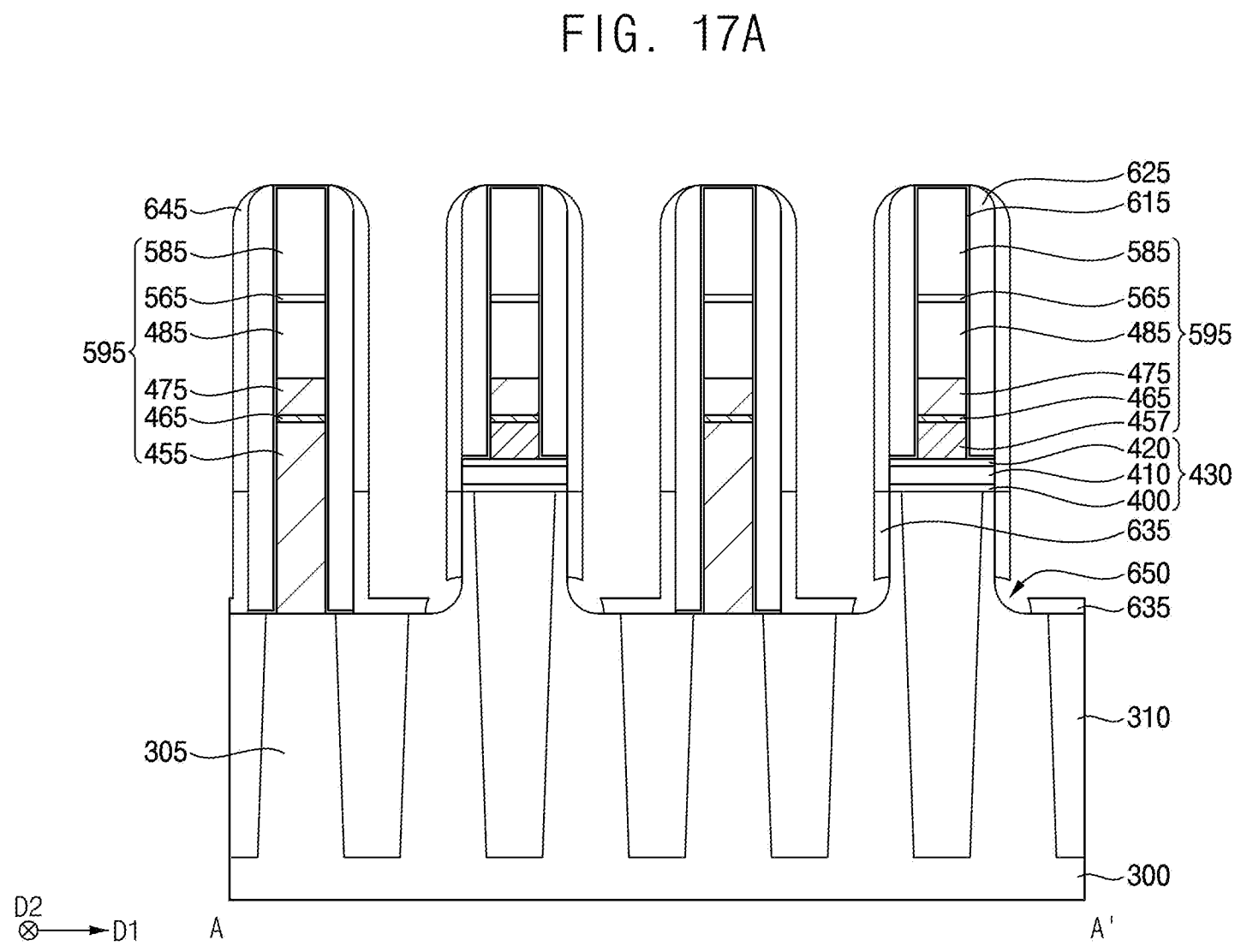

Referring to FIG. 17A, in an embodiment a wet etching process may be performed to remove the sacrificial structure that is partially exposed.

In an embodiment, the second sacrificial pattern 627 of the sacrificial structure may include an oxide, such as silicon oxide, and thus may be easily removed using an etching solution having a high etching selectivity with respect to silicon oxide. In an embodiment, the first sacrificial pattern 617 under the second sacrificial pattern 627 may include, silicon nitride that is different from silicon oxide. However, the first sacrificial pattern 617 may have a thin thickness so as to be removed by the wet etching process.

Thus, a second opening 650 may be formed to expose an upper surface of a portion of the active pattern 305.

Figure 17B:
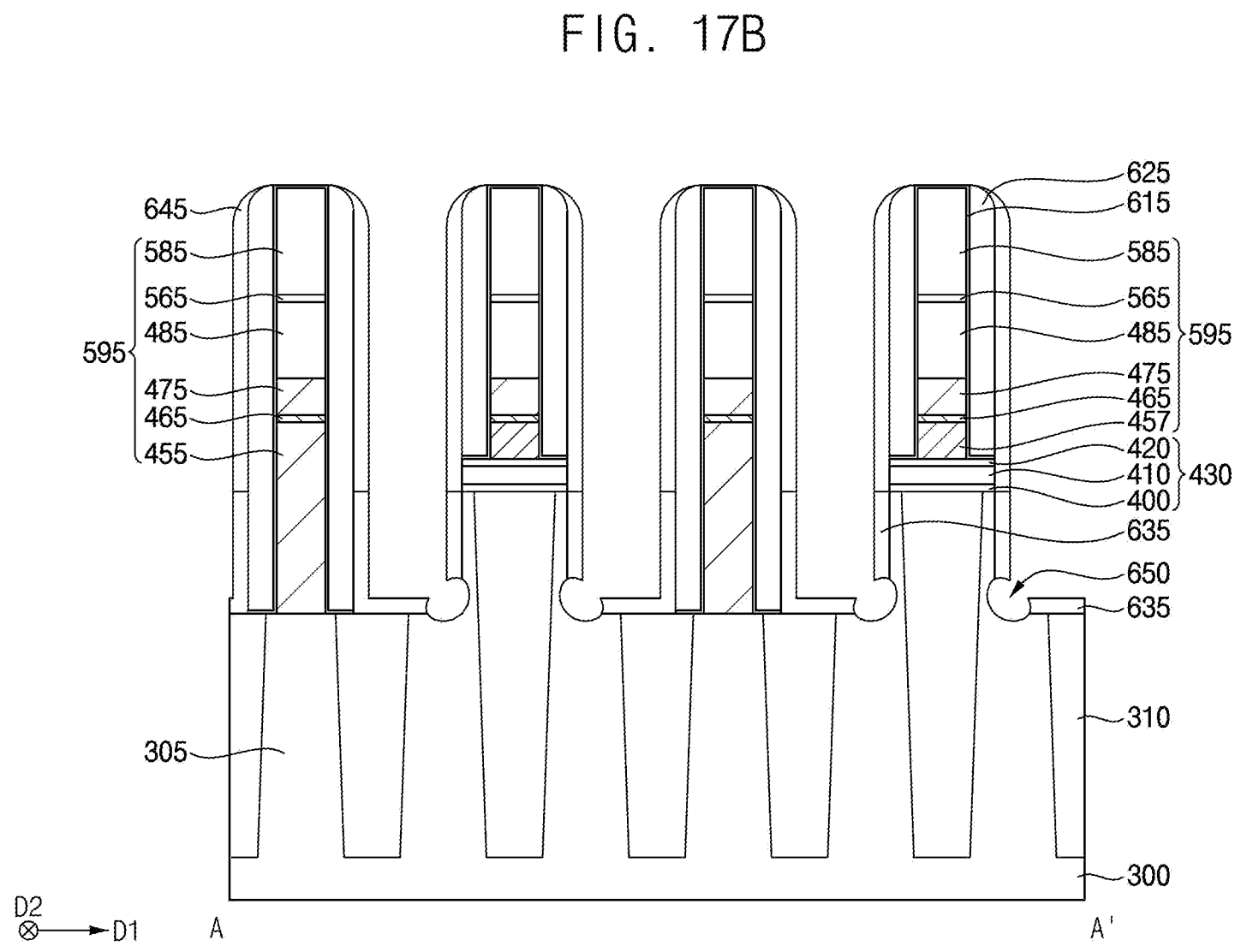

Referring to FIG. 17B, during the wet etching process, a portion of the active pattern 305 adjacent to the sacrificial structure may also be removed so that a bottom of the second opening 650 may be lower than a bottom surface of the fourth spacer 635.

Figure 18:
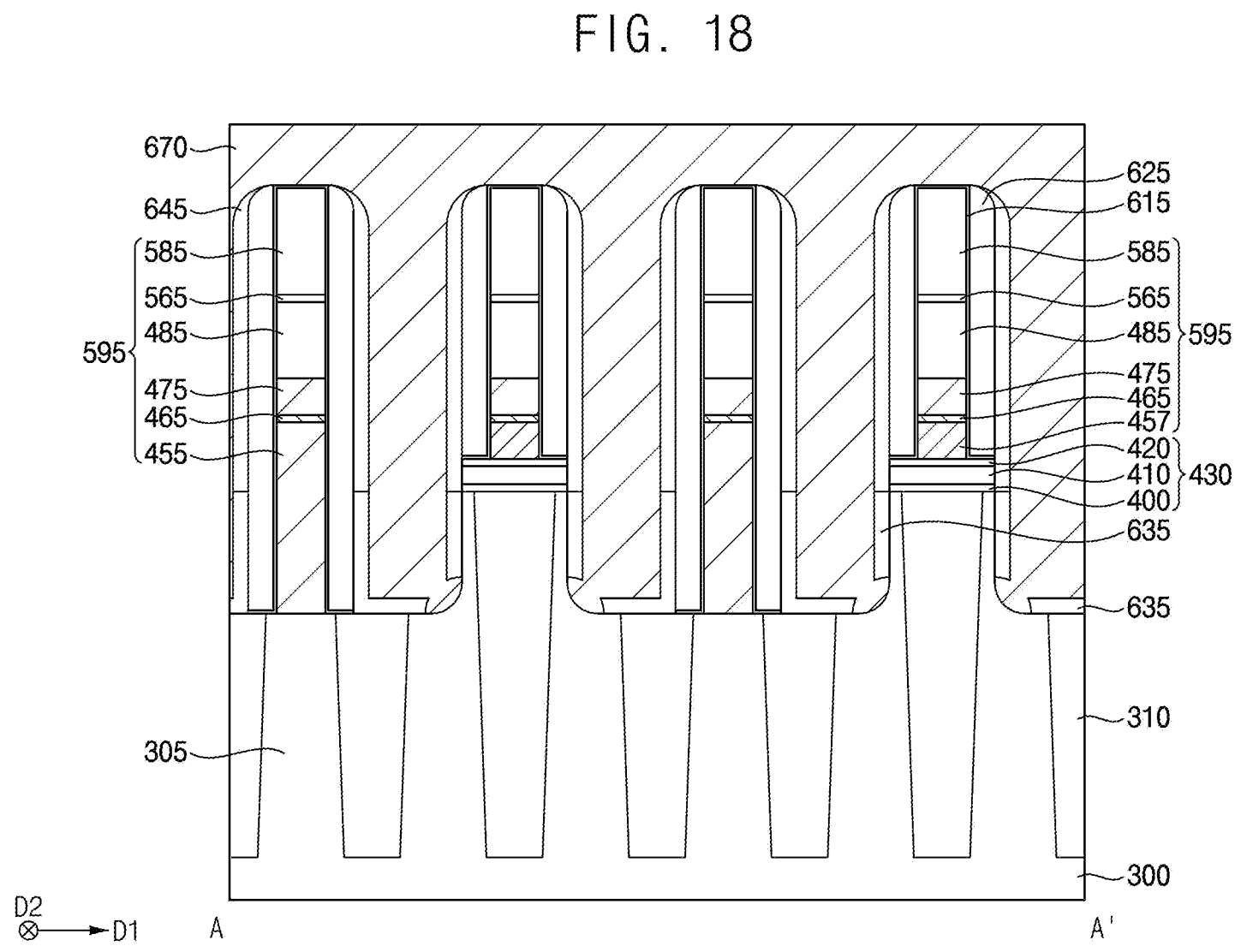

Referring to FIG. 18, a lower contact plug layer 670 may be formed on the exposed upper surface of the portion of the active pattern 305 and the first to fourth spacers 615, 625, 645 and 635 to fill a space between the bit line structures 595.

In an embodiment, the lower contact plug layer 670 may include doped polysilicon, and after forming the lower contact plug layer 670, for example, a melting laser annealing (MLA) process may be performed on the lower contact plug layer 670. However, embodiments of the present disclosure are not necessarily limited thereto.

Figure 19:
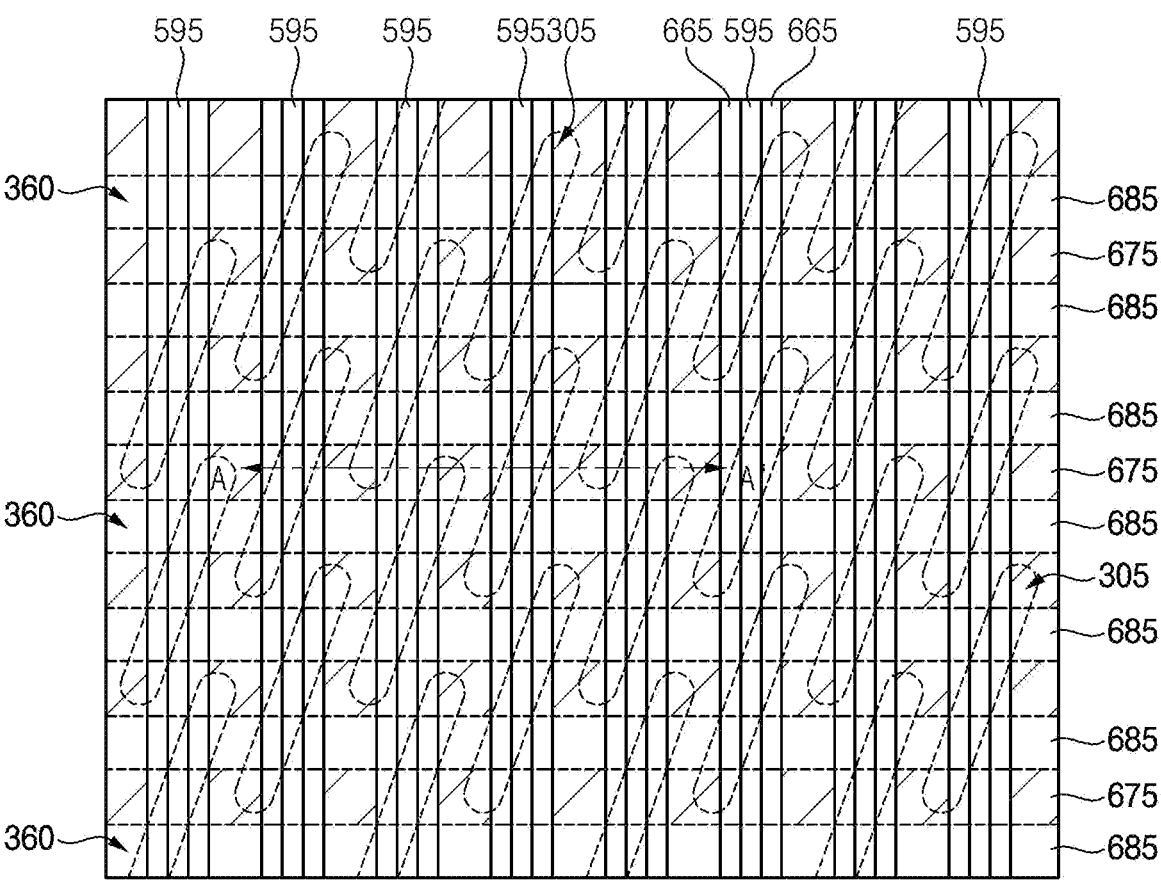
Figure 19:
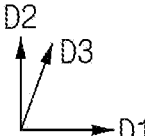
Figure 20:
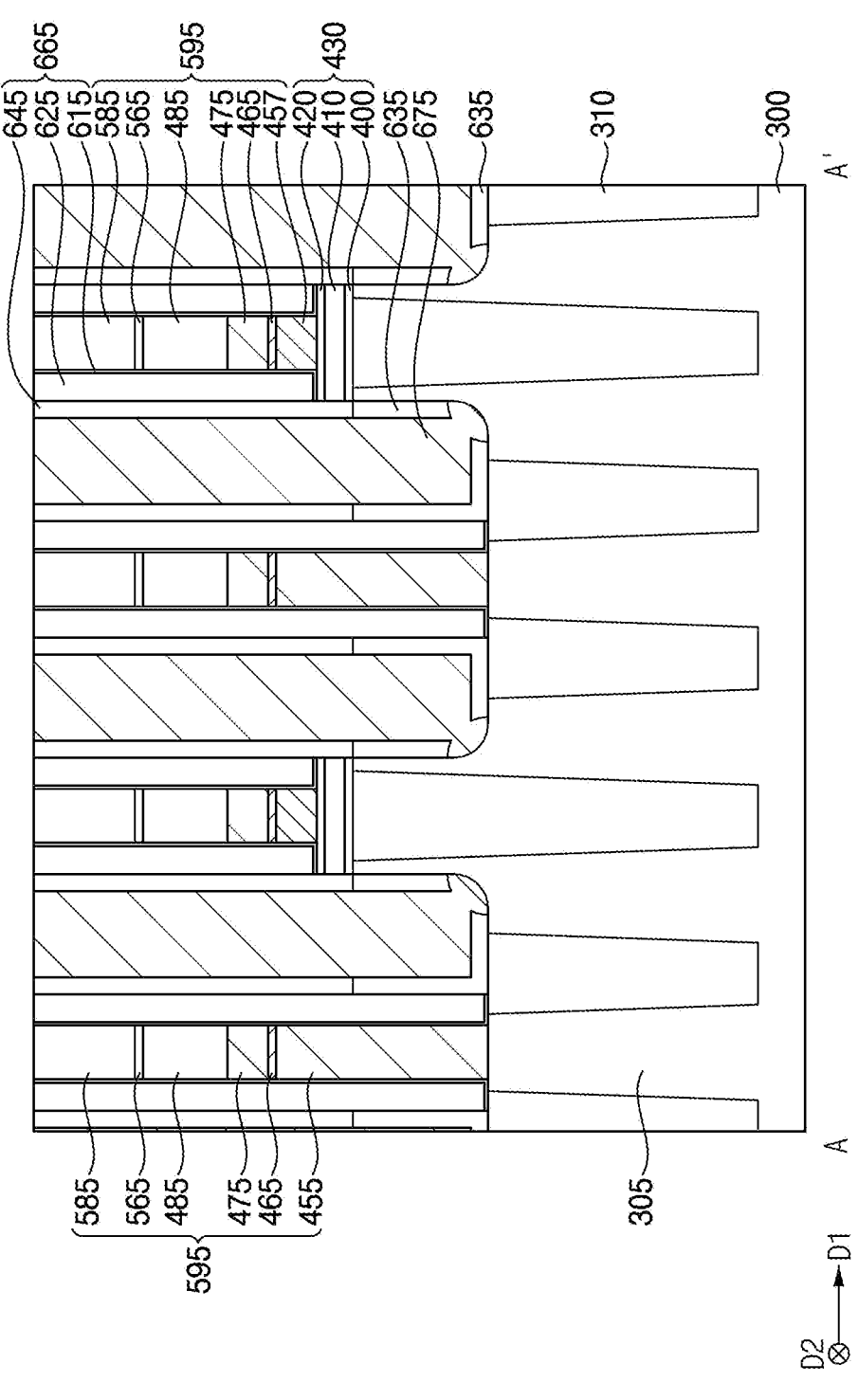

Referring to FIGS. 19 and 20, a planarization process may be performed on the lower contact plug layer 670.

In an embodiment, the planarization process may include a chemical mechanical polishing (CMP) process and/or an etch back process, and during the planarization process, the portion of the first spacer 615 on the upper surface of the bit line structure 595, and upper portions of the second and third spacers 625 and 645 may also be removed.

By the planarization process, the lower contact plug layer 670 may be divided into a plurality of lower contact plugs spaced apart from each other in the first direction D1, each of which may extend in the second direction D2 between ones of the bit line structures 595 adjacent in the first direction D1. The first to third spacers 615, 625 and 645 sequentially stacked on each of opposite sidewalls of the bit line structure 595 may form a preliminary upper spacer structure 665, which may cover a sidewall of the lower contact plug layer 670.

In an embodiment, a third mask including a plurality of third openings, each of which may extend in the first direction D1 and are spaced apart from each other in the second direction D2 may be formed on the bit line structure 595, the preliminary upper spacer structure 665 and the lower contact plug layer 670, and the lower contact plug layer 670 may be etched using the third mask as an etching mask.

In an embodiment, each of the third openings may overlap the gate structure 360 in the vertical direction. By the etching process, the lower contact plug layer 670 may be divided into a plurality of lower contact plugs 675 spaced apart from each other in the second direction D2. Additionally, a fourth opening exposing the upper surface of the gate structure 360 may be formed between the bit line structures.

The third mask may be removed, and a fourth insulation pattern 685 may be formed to fill the fourth opening. In an embodiment, the fourth insulation pattern 685 may overlap the gate structure 360 in the vertical direction.

Figure 21:
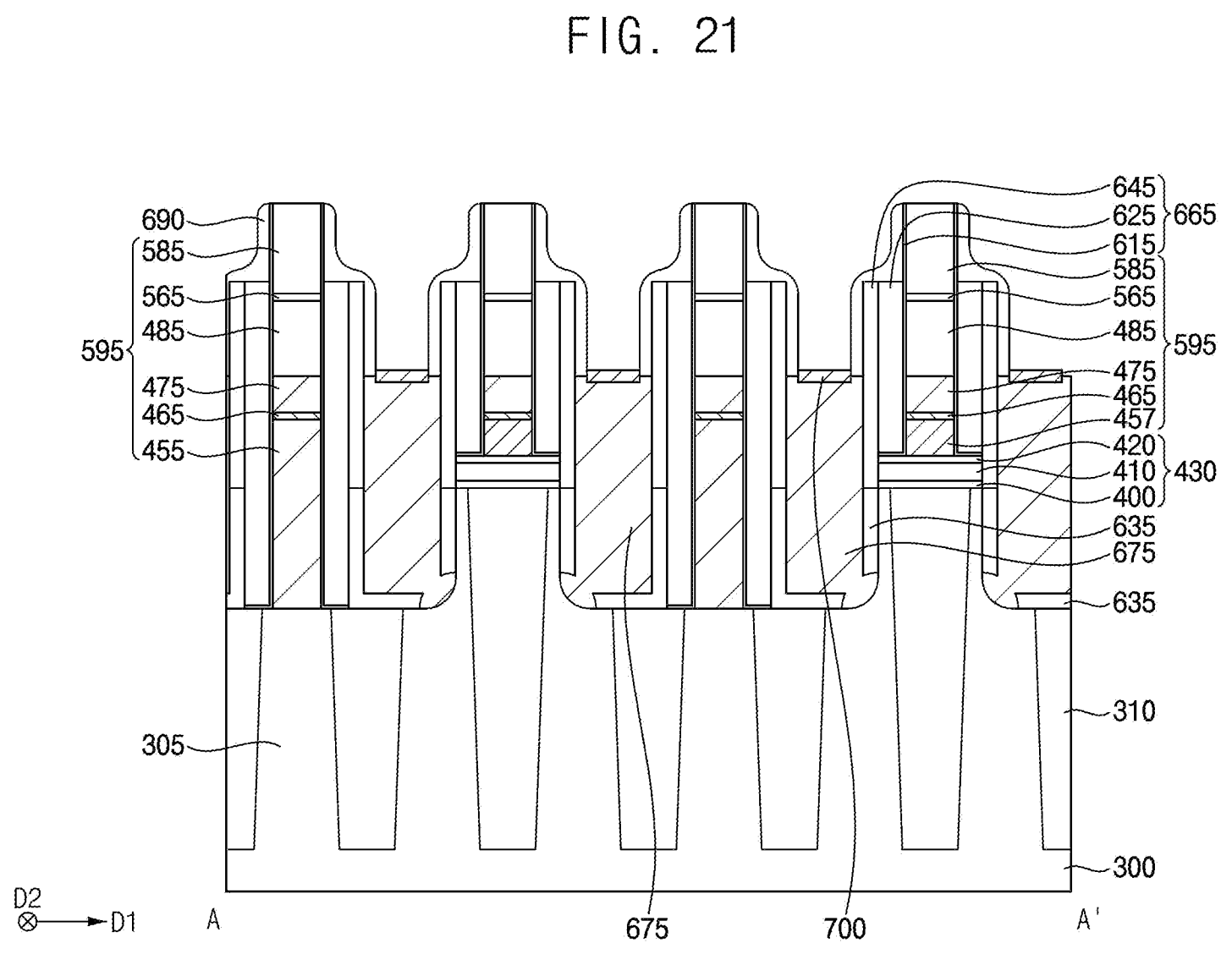

Referring to FIG. 21, an upper portion of the lower contact plug 675 may be removed to expose an upper portion of the preliminary upper spacer structure 665 on the sidewall of the bit line structure 595, and upper portion of the second and third spacers 625 and 645 of the exposed preliminary upper spacer structure 665 may be removed.

An upper portion of the lower contact plug 675 may be additionally removed. Thus, an upper surface of the lower contact plug 675 may be lower than upper surfaces of the second and third spacers 625 and 645.

A fifth spacer layer may be formed on the bit line structure 595, the preliminary upper spacer structure 665 and the lower contact plug 675, and may be anisotropically etched to form a fifth spacer 690 covering an upper portion of the preliminary upper spacer structure 665 on the sidewall of the bit line structure 595, and the upper surface of the lower contact plug 675 may be exposed.

A metal silicide pattern 700 may be formed on the exposed upper surface of the lower contact plug 675. In an embodiment, the metal silicide pattern 700 may be formed by forming a first metal layer on the capping pattern 585, the fourth insulation pattern 685, the fifth spacer 690 and the lower contact plug 675, performing a heat treatment thereon, and removing an unreacted portion of the first metal layer. However, embodiments of the present disclosure are not necessarily limited thereto.

Figure 22:
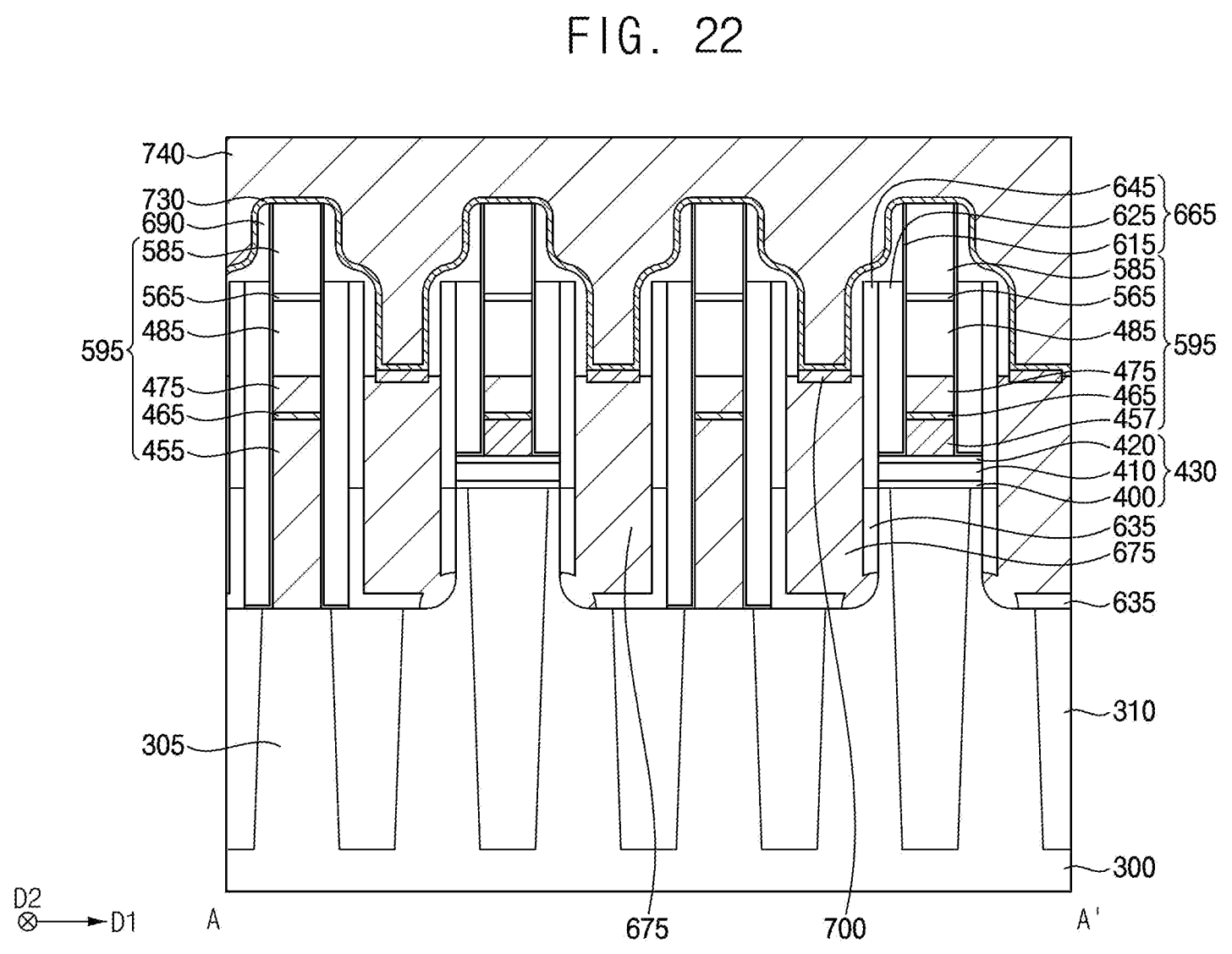

Referring to FIG. 22, a second barrier layer 730 may be formed on the capping pattern 585, the fourth insulation pattern 685, the fifth spacer 690, the metal silicide pattern 700 and the lower contact plug 675, and a second metal layer 740 may be formed on (e.g., formed directly thereon) the second barrier layer 730 to fill a space between the bit line structures 595.

In an embodiment, a planarization process may be performed on an upper portion of the second metal layer 740. The planarization process may include, for example, a chemical mechanical polishing (CMP) process and/or an etch-back process.

Referring to FIGS. 23 and 24, the second metal layer 740 and the second barrier layer 730 may be patterned to form an upper contact plug 755. In an embodiment, a plurality of upper contact plugs 755 may be formed, and a fifth opening 760 may be formed between the upper contact plugs 755.

The fifth opening 760 may be formed by partially removing the capping pattern 585, the fourth insulation pattern 685, the preliminary upper spacer structure 665 and the fifth spacer 690 as well as the second metal layer 740 and the second barrier layer 730.

The upper contact plug 755 may include a second metal pattern 745 and a second barrier pattern 735 covering a lower surface of the second metal pattern 745. In an embodiment, the upper contact plug 755 may have a shape of a circle, an ellipse, or a rounded polygon in a plan view, and the upper contact plugs 755 may be arranged, for example, in a honeycomb pattern in the first and second direction D1 and D2, in a plan view. However, embodiments of the present disclosure are not necessarily limited thereto.

The lower contact plug 675, the metal silicide pattern 700 and the upper contact plug 755 sequentially stacked on the substrate 300 may collectively form a contact plug structure.

Figure 25:
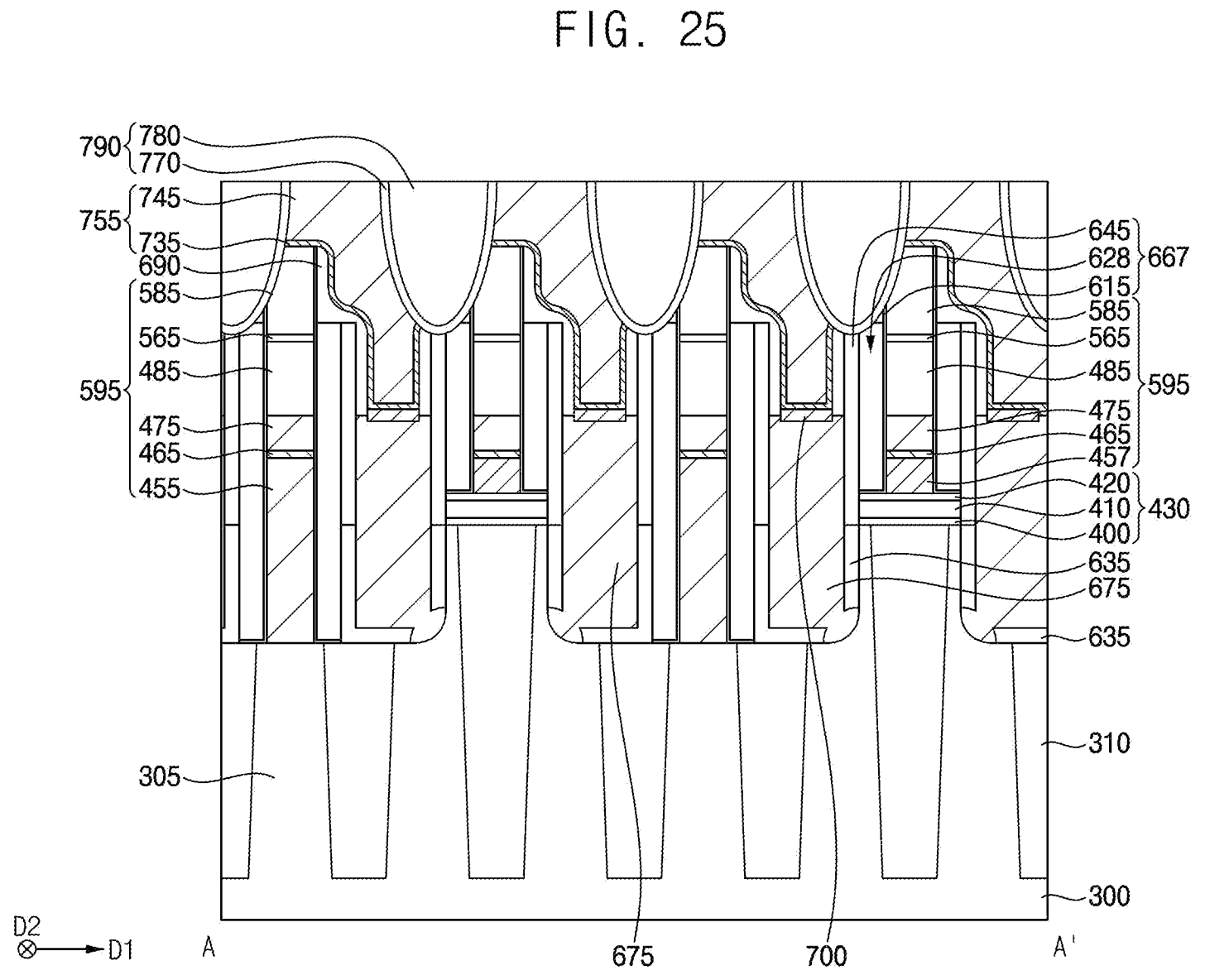

Referring to FIG. 25, the second spacer 625 included in the preliminary upper spacer structure 665 exposed by the fifth opening 760 may be removed to form an air gap. A fifth insulation pattern 770 may be formed on a bottom and a sidewall of the fifth opening 760, and a sixth insulation pattern 780 may be formed to fill a remaining portion of the fifth opening 760.

Each of the fifth and sixth insulation patterns 770 and 780 may form a second insulation pattern structure 790.

A top end of the air gap may be covered by the fifth insulation pattern 770, and thus an air spacer 628 may be formed. The first spacer 615, the air spacer 628 and the third spacer 645 may form an upper spacer structure 667. The upper spacer structure 667 and the fourth and fifth spacers 635 and 690 may be referred to as a spacer structure.

Referring to FIGS. 1, 2A and 2B again, a lower electrode 800 may be formed on an upper surface of the upper contact plug 755, a dielectric layer 810 may be formed on the lower electrode 800, the second insulation pattern structure 790 and the fourth insulation pattern 685, and an upper electrode 820 may be formed on the dielectric layer 810.

The lower electrode 800, the dielectric layer 810 and the upper electrode 820 sequentially stacked may collectively form a capacitor 830.

Upper wirings may be further formed on the capacitor 830 to complete the fabrication of the semiconductor device.

As illustrated above, the first opening 440, which may expose the upper surface of the central portion in the third direction D3 of the active pattern 305 so that the bit line structure 495 may directly contact the active pattern 305 through the first opening 440, may be formed by the etching process using the first mask 900, which may not entirely cover but may only partially cover each of the end portions in the third direction D3 of adjacent ones of the active patterns 305 in the first direction D1, as an etching mask. Thus, the first opening 440 may have a relatively large area, and when the preliminary second conductive pattern 452 in the first opening 440 is patterned to form the bit line structure 595 by the etching process, a residue of the preliminary second conductive pattern 452 may not remain in the first opening 440.

The first opening 440 may expose a portion of each of the end portions in the third direction D3 of the adjacent ones of the active patterns 305 in the first direction D1, and as the second spacer layer 620 on the sidewall of the bit line structure 595 is anisotropically etched, the second sacrificial pattern 627 may remain on an upper surface of the exposed portion of each of the end portions in the third direction D3 of the adjacent ones of the active patterns 305 in the first direction D1.

The fourth and third spacers 635 and 645, which may be formed by forming the filling pattern 630 covering the second sacrificial pattern 627 and the third spacer layer 640 and etching the filling pattern 630 and the third spacer layer 640, may not cover but may at partially expose the second sacrificial pattern 627, and the second sacrificial pattern 627 that is partially exposed and the first sacrificial pattern 617 having a thin thickness may be removed, such as by a wet etching process, to form the second opening 650 exposing the end portion of the active pattern 305. The lower contact plug 675 may be formed to directly contact the upper surface of the exposed end portion of the active pattern 305 to fill the second opening 650.

The second sacrificial patterns 627 may be formed by forming the second spacer layer 620 on the sidewall of the bit line structure 595 and anisotropically etching the second spacer layer 620. The second sacrificial patterns 627 may be formed on portions of the active patterns 305 adjacent to opposite sidewalls of the bit line structures 595, and distributions of sizes and/or locations of the second sacrificial patterns 627 are not high (e.g., are relatively low).

For example, if a spacer layer is formed on the sidewalls of the bit line structures, a lower portion of the spacer layer is removed by an etching process to form openings exposing upper surfaces of the active patterns, and the lower contact plugs are formed in the openings, respectively, as distances between the bit line structures decrease in order to increase the integration degree of the semiconductor device, distribution of sizes and locations of the openings may be high, and in some cases, some of the openings may not expose the upper surface of the active pattern. Thus, some of the lower contact plugs may not be electrically connected to the active pattern.

However, in an embodiment of the present disclosure, the distribution of the sizes and/or the locations of the second sacrificial patterns 627 may not be high (e.g., are relatively low), and thus distribution of sizes and/or locations of the second openings 650 that may be formed by removing the second sacrificial patterns 627 may not be high, either. Additionally, the second sacrificial patterns 627 may be removed not by a dry etching process but by a wet etching process so as to be easily removed. Thus, the second openings 650 may expose the upper surface of the end portion of the active pattern 405 well, and electric connection between the lower contact plugs 675 filling the second openings 650 and the active pattern 305 may be increased.

While the present disclosure have been shown and described with reference to non-limiting embodiments thereof, it will be understood by those of ordinary skill in the art that various changes in form and details may be made thereto without departing from the spirit and scope of the present disclosure.

What is claimed is:

1. A semiconductor device comprising:
an active pattern on a substrate;
a bit line structure on the active pattern;
a spacer structure on a sidewall of the bit line structure; and
a lower contact plug directly contacting the spacer structure,
wherein the spacer structure includes:
a first spacer covering an upper sidewall of the lower contact plug; and
a second spacer having a first part covering a lower sidewall of the lower contact plug and a second part covering a portion of a lower surface of the lower contact plug, and wherein the lower contact plug includes:
an extension portion covered by the first and second spacers; and
a protrusion portion protruding from an opening between the first and second parts of the second spacer, a bottom surface of the protrusion portion is disposed at a level that is lower than or equal to a level of a bottom surface of the second spacer.

2. The semiconductor device according to claim 1, wherein the level of the bottom surface of the protrusion portion of the lower contact plug is lower than the level of the bottom surface of the second spacer.

3. The semiconductor device according to claim 1, wherein the spacer structure includes:
a third spacer directly contacting the sidewall of the bit line structure; and
a fourth spacer directly contacting an outer sidewall of the first spacer, and
wherein an upper outer sidewall of the fourth spacer directly contacts the first spacer, and a lower outer sidewall of the fourth spacer directly contacts the second spacer.

4. The semiconductor device according to claim 3, wherein:
each of the first to third spacers includes a nitride; and
the fourth spacer includes air.

5. The semiconductor device according to claim 1, wherein:
the bit line structure is one of a plurality of bit line structures spaced apart from each other in a first direction substantially parallel to an upper surface of the substrate, each of the plurality of bit line structures extending in a second direction substantially parallel to the upper surface of the substrate,
the active pattern is one of a plurality of active patterns spaced apart from each other in the first and second directions, each of the plurality of active patterns extending in a third direction substantially parallel to the upper surface of the substrate and having an acute angle with respect to the first and second directions,
each of the plurality of bit line structures is disposed on central portions of ones of the plurality of active patterns, and
the spacer structure is disposed on each of opposite sidewalls in the first direction of each of the plurality of bit line structures, so that a plurality of spacer structures are arranged in the first direction.

6. The semiconductor device according to claim 5, wherein:
a first bit line structure among the plurality of bit line structures is disposed on a central portion of a first active pattern among the plurality of active patterns, and a first spacer structure among the plurality of spacer structures is disposed on a sidewall of the first bit line structure,
wherein the protrusion portion of the lower contact plug directly contacting the first spacer structure directly contacts an end portion in the third direction of a second active pattern among the plurality of active patterns, the second active pattern is adjacent to the first active pattern in the first direction.

7. The semiconductor device according to claim 6, wherein a level of an upper surface of the central portion of the first active pattern is lower than a level of an uppermost surface of the second active pattern.

8. The semiconductor device according to claim 6, wherein:

a second bit line structure among the plurality of bit line structures is disposed on a central portion of the second active pattern, and a second spacer structure among the plurality of spacer structures is disposed on a sidewall of the second bit line structure, the second bit line structure is adjacent to the first bit line structure in the first direction, wherein an insulation pattern structure is disposed between the second spacer structure and an uppermost surface of the second active pattern.

9. The semiconductor device according to claim 8, wherein:

the insulation pattern structure is disposed on a portion of the end portion in the third direction of the second active pattern, and wherein the insulation pattern structure does not overlap other portions of the end portion of the second active pattern in a vertical direction substantially perpendicular to the upper surface of the substrate.

10. The semiconductor device according to claim 8, wherein the second spacer structure covers a sidewall of the insulation pattern structure.

11. The semiconductor device according to claim 10, wherein the second spacer structure covers an upper sidewall of the end portion in the third direction of the second active pattern.

12. The semiconductor device according to claim 8, further comprising:

an isolation pattern covering sidewalls of the plurality of active patterns, wherein a portion of the isolation pattern covering a sidewall of the second active pattern directly contacts a lower surface of the insulation pattern structure.

13. The semiconductor device according to claim 1, further comprising:

an upper contact plug on the lower contact plug; and a capacitor on the upper contact plug.

14. A semiconductor device comprising:

an active pattern on a substrate;

a bit line structure on the active pattern;

a spacer structure on a sidewall of the bit line structure; and a lower contact plug directly contacting the spacer structure, wherein the spacer structure includes:

a first spacer covering a sidewall of the bit line structure;

a second spacer directly contacting an outer sidewall of the first spacer;

a third spacer directly contacting an upper outer sidewall of the second spacer; and a fourth spacer directly contacting a lower outer sidewall of the second spacer, and wherein the lower contact plug includes:

an extension portion covered by the third and fourth spacers; and a protrusion portion extending from the third and fourth spacers, a bottom surface of the protrusion portion is disposed at a level that is lower than or equal to a level of a bottom surface of the fourth spacer.

15. The semiconductor device according to claim 14, wherein the level of the bottom surface of the protrusion portion of the lower contact plug is lower than the level of the bottom surface of the fourth spacer.

16. The semiconductor device according to claim 14, wherein:

each of the first, third and fourth spacers includes a nitride; and the second spacer includes air.

17. A semiconductor device comprising:

active patterns disposed on a substrate in first and second directions, the first and second directions being substantially parallel to an upper surface of the substrate and substantially perpendicular to each other, and each of the active patterns extending in a third direction substantially parallel to the upper surface of the substrate and having an acute angle with respect to the first and second directions;

bit line structures disposed in the first direction, each of the bit line structures extending in the second direction on central portions in the third direction of ones of the active patterns;

spacer structures on opposite sidewalls, respectively, in the first direction of the bit line structures;

a contact plug structure on an end portion in the third direction of each of the active patterns; and a capacitor on the contact plug structure, wherein the contact plug structure includes:

an extension portion covered by the spacer structures; and a protrusion portion protruding from the spacer structures, a bottom surface of the protrusion portion is disposed at a level that is lower than or equal to a level of a bottom surface of the spacer structures.

18. The semiconductor device according to claim 17, wherein:

a first bit line structure among the bit line structures is disposed on a central portion of a first active pattern among the active patterns, and a first spacer structure among the spacer structures is disposed on a sidewall of the first bit line structure, wherein the protrusion portion of the contact plug structure directly contacting the first spacer structure directly contacts an end portion in the third direction of a second active pattern among the active patterns, the second active pattern is adjacent to the first active pattern in the first direction.

19. The semiconductor device according to claim 18, wherein:

a second bit line structure among the bit line structures is disposed on a central portion of the second active pattern, and a second spacer structure among the spacer structures is disposed on a sidewall of the second bit line structure, the second bit line structure is adjacent to the first bit line structure in the first direction, wherein an insulation pattern structure is disposed between the second spacer structure and an uppermost surface of the second active pattern.

20. The semiconductor device according to claim 19, wherein:

the insulation pattern structure is disposed on a portion of the end portion in the third direction of the second active pattern, and wherein the insulation pattern structure does not overlap other portions of the end portion of the second active pattern in a vertical direction substantially perpendicular to the upper surface of the substrate.

* * * * *